US012713639B2

(12) United States Patent
Kim

(10) Patent No.: US 12,713,639 B2
(45) Date of Patent: Aug. 18, 2026

(54) SEMICONDUCTOR MEMORY DEVICE, METHOD FOR FABRICATING THE SAME AND ELECTRONIC SYSTEM INCLUDING THE SAME

(71) Applicant: Samsung Electronics Co., Ltd., Suwon-si (KR)

(72) Inventor: Ki Joon Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 376 days.

(21) Appl. No.: 18/504,637

(22) Filed: Nov. 8, 2023

(65) Prior Publication Data

US 2024/0306383 A1 Sep. 12, 2024

(30) Foreign Application Priority Data

Mar. 8, 2023 (KR) ........................ 10-2023-0030324

(51) Int. Cl.

| | |
|---|---|
| ***H10B 43/27*** | (2023.01) |
| ***H10B 43/35*** | (2023.01) |
| ***H10D 30/47*** | (2025.01) |
| ***H10D 64/01*** | (2025.01) |
| ***H10D 64/68*** | (2025.01) |

(52) U.S. Cl.

CPC ........... *H10D 30/485* (2025.01); *H10B 43/27* (2023.02); *H10B 43/35* (2023.02); *H10D 64/033* (2025.01); *H10D 64/689* (2025.01)

(58) Field of Classification Search

CPC .... H10D 30/47; H10D 30/471; H10D 30/474; H10D 30/476; H10D 30/481; H10D 30/485; H10D 30/501; H10D 30/502; H10D 30/503; H10D 30/504; H10D 30/506; H10D 30/507; H10D 30/508; H10D 30/509; H10D 64/033; H10D 64/689; H10D 30/701; H10D 30/477; H10D 30/478; H10D 30/6741; H10B 41/27; H10B 41/10; H10B 41/35; H10B 41/40; H10B 43/10; H10B 43/27; H10B 43/35; H10B 43/40; H10B 80/00; H10B 51/10; H10B 51/20; H10B 51/30; G11C 5/063; H10W 90/00; H10W 90/752

See application file for complete search history.

(56) References Cited

U.S. PATENT DOCUMENTS

| | | | |
|---|---|---|---|
| 11,171,239 | B2 | 11/2021 | Naylor et al. |
| 11,282,932 | B2 | 3/2022 | Okada et al. |
| 11,417,674 | B2 | 8/2022 | Seki et al. |

(Continued)

*Primary Examiner* — Eduardo A Rodela

(74) *Attorney, Agent, or Firm* — Harness, Dickey & Pierce, P.L.C.

(57) ABSTRACT

A semiconductor memory device having improved characteristics may be provided. The semiconductor memory device includes a cell substrate, a plurality of gate electrodes sequentially stacked on the cell substrate, a semiconductor layer extending in a vertical direction, intersecting an upper side of the cell substrate, and intersecting the plurality of gate electrodes, and a gate dielectric layer including ferroelectrics between each of the gate electrodes and the semiconductor layer, wherein the semiconductor layer includes an n-type channel layer and a p-type channel layer each extending in the vertical direction, and the n-type channel layer includes an oxide 2-dimensional electron gas (2-DEG) layer extending in the vertical direction.

20 Claims, 37 Drawing Sheets

(56) References Cited

U.S. PATENT DOCUMENTS

| | | | | |
|---|---|---|---|---|
| 12,058,863 | B2 * | 8/2024 | Kim ....................... | H10B 43/10 |
| 2022/0045060 | A1 | 2/2022 | Sills et al. | |
| 2022/0059570 | A1 | 2/2022 | Tanaka et al. | |
| 2022/0189972 | A1 | 6/2022 | Lee et al. | |
| 2022/0246766 | A1 | 8/2022 | Manfrini et al. | |

* cited by examiner

SEMICONDUCTOR MEMORY DEVICE, METHOD FOR FABRICATING THE SAME AND ELECTRONIC SYSTEM INCLUDING THE SAME

This application claims priority from Korean Patent Application No. 10-2023-0030324 filed on Mar. 8, 2023 in the Korean Intellectual Property Office, and all the benefits accruing therefrom under 35 U.S.C. 119, the contents of which in its entirety are herein incorporated by reference.

BACKGROUND

1. Field

The present disclosure relates to semiconductor memory devices, methods for fabricating the same, and/or electronic systems including the same. More specifically, the present disclosure relates to semiconductor memory devices including memory cells arranged three-dimensionally, methods for fabricating the same, and/or electronic systems including the same.

2. Description of the Related Art

As semiconductor memory devices capable of storing a high capacity of data are required in electronic systems, measures capable of increasing a data storage capacity of the semiconductor memory devices are being researched. As one of measures capable of increasing the data storage capacity of the semiconductor memory devices, a semiconductor memory device including memory cells arranged three-dimensionally instead of memory cells arranged two-dimensionally is being proposed.

SUMMARY

Some example embodiments of the present disclosure provide semiconductor memory devices having improved characteristics.

Some example embodiments of the present disclosure also provide methods for fabricating the semiconductor memory device having improved characteristics.

Some example embodiments of the present disclosure also provide electronic systems including the semiconductor memory device having improved degree of integration and memory capacity.

However, example embodiments of the present disclosure are not restricted to the ones set forth herein. The above and other example embodiments of the present disclosure will become more apparent to one of ordinary skill in the art to which the present disclosure pertains by referencing the detailed description of the present disclosure given below.

According to an example embodiment of the present disclosure, a semiconductor memory device may include a cell substrate, a plurality of gate electrodes sequentially stacked on the cell substrate, a semiconductor layer extending in a vertical direction, intersecting an upper side of the cell substrate, and intersecting the plurality of gate electrodes, and a gate dielectric layer including ferroelectrics between each of the gate electrodes and the semiconductor layer, wherein the semiconductor layer includes an n-type channel layer and a p-type channel layer each extending in the vertical direction, and the n-type channel layer includes an oxide 2-dimensional electron gas (2-DEG) layer extending in the vertical direction.

According to an example embodiment of the present disclosure, a semiconductor memory device may include a cell substrate, a mold structure including a plurality of gate electrodes sequentially stacked on the cell substrate, a channel structure extending in a vertical direction, intersecting an upper side of the cell substrate, and penetrating the mold structure, and a bit line on the mold structure, wherein the channel structure includes a ferroelectric layer, an n-type channel layer, a p-type channel layer, and a core insulating layer that are sequentially stacked on side surfaces of each of the gate electrodes, each of the n-type channel layer and the p-type channel layer electrically connect the cell substrate and the bit line, and the n-type channel layer includes a first oxide layer, a second oxide layer, and an interfacial layer, the first oxide layer and the second oxide layer being sequentially stacked on the ferroelectric layer, the interfacial layer including an oxygen vacancy between the first oxide layer and the second oxide layer.

According to an example embodiment of the present disclosure, an electronic system may include a main board, a semiconductor memory device on the main board, and a controller electrically connected to the semiconductor memory device, on the main substrate, wherein the semiconductor memory device includes a cell substrate, a plurality of gate electrodes sequentially stacked on the cell substrate, a semiconductor layer extending in a vertical direction, intersecting an upper side of the cell substrate, and intersecting the plurality of gate electrodes, and a gate dielectric layer including ferroelectrics, between each of the gate electrodes and the semiconductor layer, wherein the semiconductor layer includes an n-type channel layer and a p-type channel layer each extending in the vertical direction, and the n-type channel layer includes an oxide 2-dimensional electron gas (oxide 2-DEG) layer extending in the vertical direction.

BRIEF DESCRIPTION OF DRAWINGS

The above and other aspects and features of the present disclosure will become more apparent by describing in detail some example embodiments thereof with reference to the attached drawings, in which:

FIG. 3 is a schematic layout diagram for explaining a semiconductor memory device according to an example embodiment;

DETAILED DESCRIPTION

Expressions such as "at least one of," when preceding a list of elements, modify the entire list of elements and do not modify the individual elements of the list. For example, an expression such as "at least one of A, B, and C" or "at least one selected from the group consisting of A, B, and C" may be interpreted as only A, only B, only C, or any combination of two or more of A, B, and C, such as A, B, and C, A and B, B and C, and A and C.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

A semiconductor memory device according to some example embodiments will be described below with reference to FIGS. 1 to 6.

Figure 1:
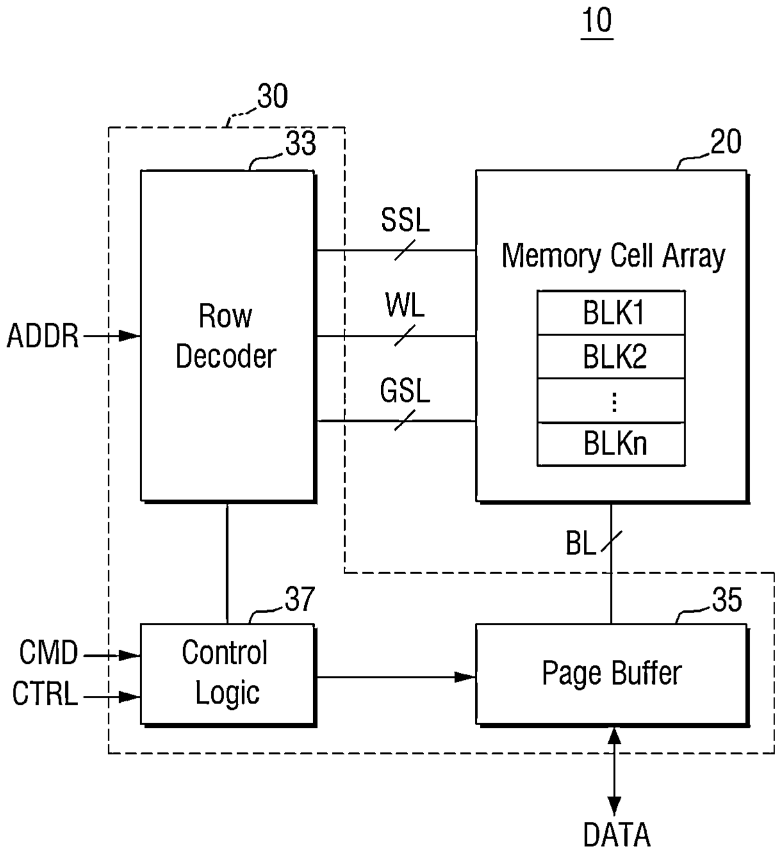
FIG. 1 is an example block diagram for explaining a semiconductor memory device according to an example embodiment.

FIG. 1 is an example block diagram for explaining a semiconductor memory device according to an example embodiment.

Referring to FIG. 1, a semiconductor memory device 10 according to an example embodiment includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. For example, the memory cell blocks BLK1 to BLKn may be connected to a row decoder 33 through the word line WL, the string selection line SSL, and the ground selection line GSL. Further, the memory cell blocks BLK1 to BLKn may be connected to a page buffer 35 through the bit line BL.

The peripheral circuit 30 may receive an address ADDR, a command CMD and a control signal CTRL from outside of the semiconductor memory device 10, and may transmit and receive data DATA to and from a device outside the semiconductor memory device 10. The peripheral circuit 30 may include a control logic 37, a row decoder 33, and a page buffer 35. Although not shown, the peripheral circuit 30 may further include various sub-circuits such as an I/O circuit, a voltage generation circuit that generates various voltages desired for the operation of the semiconductor memory device 10, and an error correction circuit that corrects errors of the data DATA read from the memory cell array 20.

The control logic 37 may be connected to the row decoder 33, the I/O circuit, and the voltage generation circuit. The control logic 37 may control the overall operations of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation such as a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transfer a voltage for performing the memory operation to the word line WL of the selected memory cell blocks BLK1 to BLKn.

The page buffer 35 may be connected to the memory cell array 20 through the bit line BL. The page buffer 35 may operate as a writer driver or a sense amplifier. For example, when the program operation is performed, the page buffer 35 may operates as the write driver to apply a voltage according to the data DATA to be stored in the memory cell array 20 to the bit line BL. On the other hand, when the read operation is performed, the page buffer 35 may operate as a sense amplifier to sense the data DATA stored in the memory cell array 20.

Figure 2:
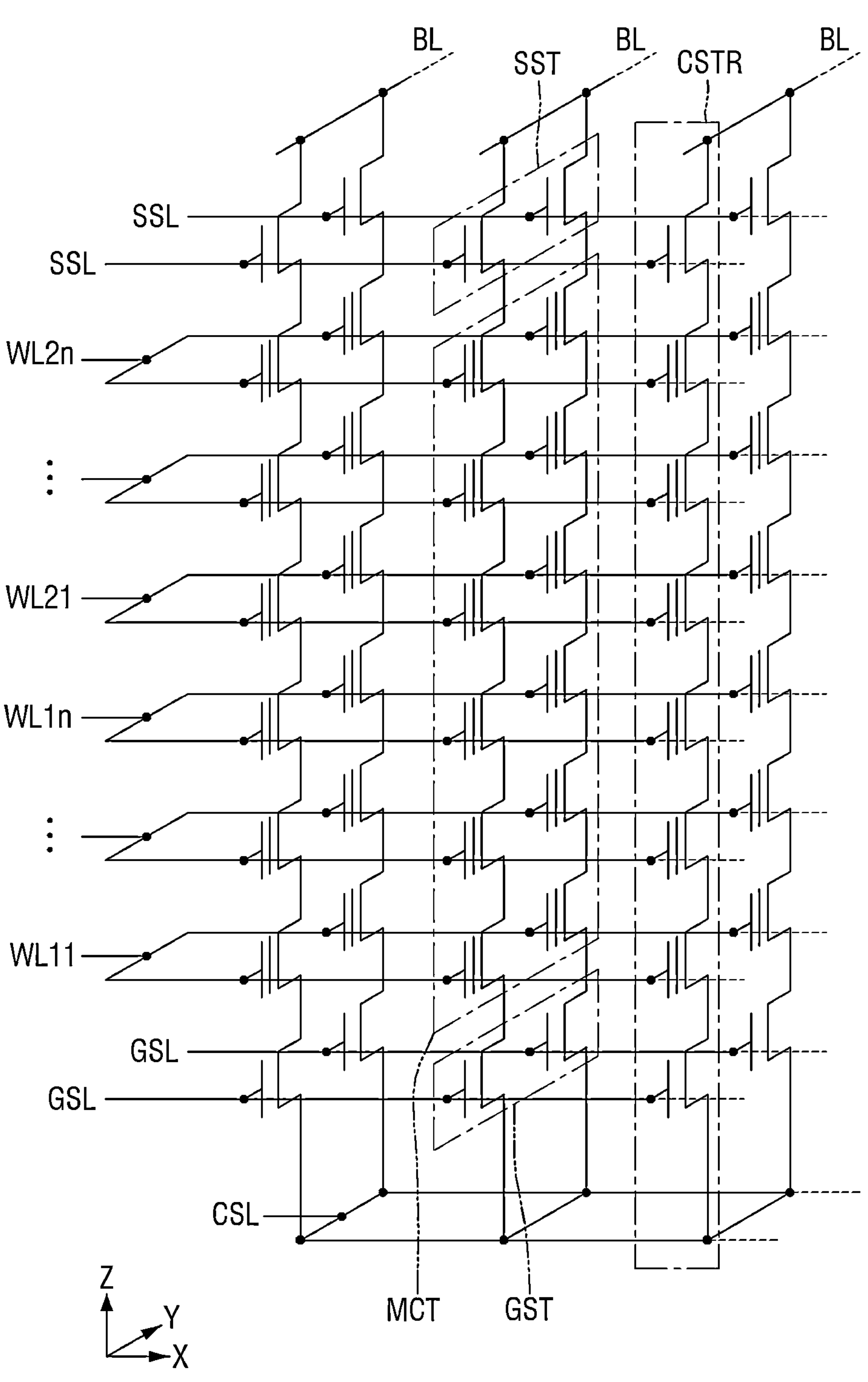
FIG. 2 is an example circuit diagram for explaining a semiconductor memory device according to an example embodiment.

FIG. 2 is an example circuit diagram for explaining a semiconductor memory device according to an example embodiment.

Referring to FIG. 2, the memory cell array (e.g., 20 of FIG. 1) of the semiconductor device according to an example embodiment may include a common source line CSL, a plurality of bit lines BL, and a plurality of cell strings CSTR.

The plurality of bit lines BL may be arranged two-dimensionally in a plane including the first direction X and the second direction Y. For example, the bit lines BL may be arranged along the first direction X to be spaced apart from each other, and extend in the second direction Y. A plurality of cell strings CSTR may be connected in parallel to each bit line BL. The cell strings CSTR may be commonly connected to the common source line CSL. That is, the plurality of cell strings CSTR may be disposed between the bit line BL and the common source line CSL.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST and the memory cell transistors MCT may be connected in series.

The common source line CSL may be commonly connected to sources of the ground selection transistors GST.

Further, the ground selection line GSL, a plurality of word lines WL11 to WL1$n$ and WL21 to WL2$n$, and the string selection line SSL may be disposed between the common source line CSL and the bit line BL. The ground selection line GSL may be used as a gate electrode of the ground selection transistor GST, the word lines WL11 to WL1$n$ and WL21 to WL2$n$ may be used as gate electrodes of the memory cell transistors MCT, and the string selection line SSL may be used as the gate electrode of the string selection transistor SST.

Figure 3:
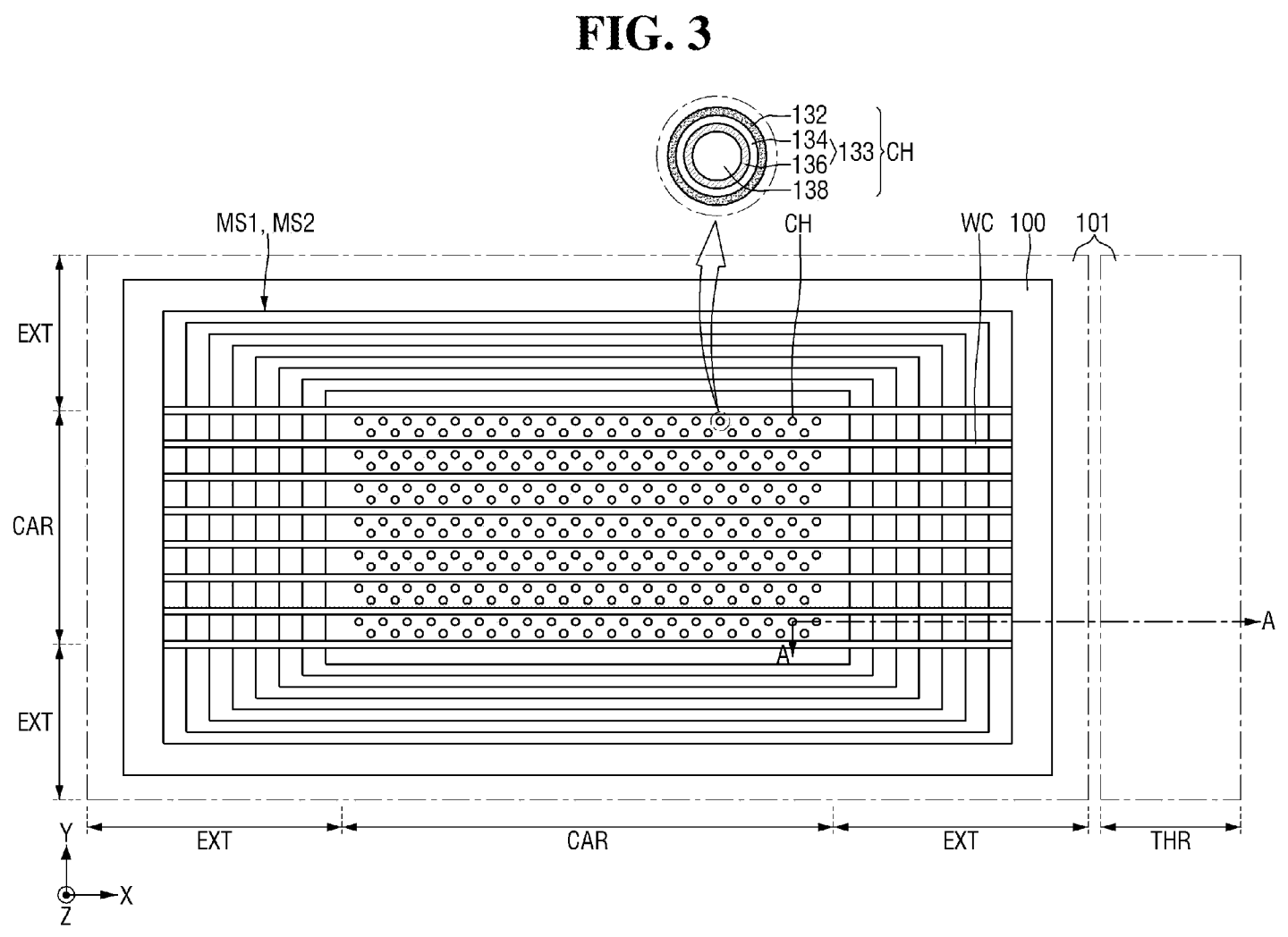
Figure 4:
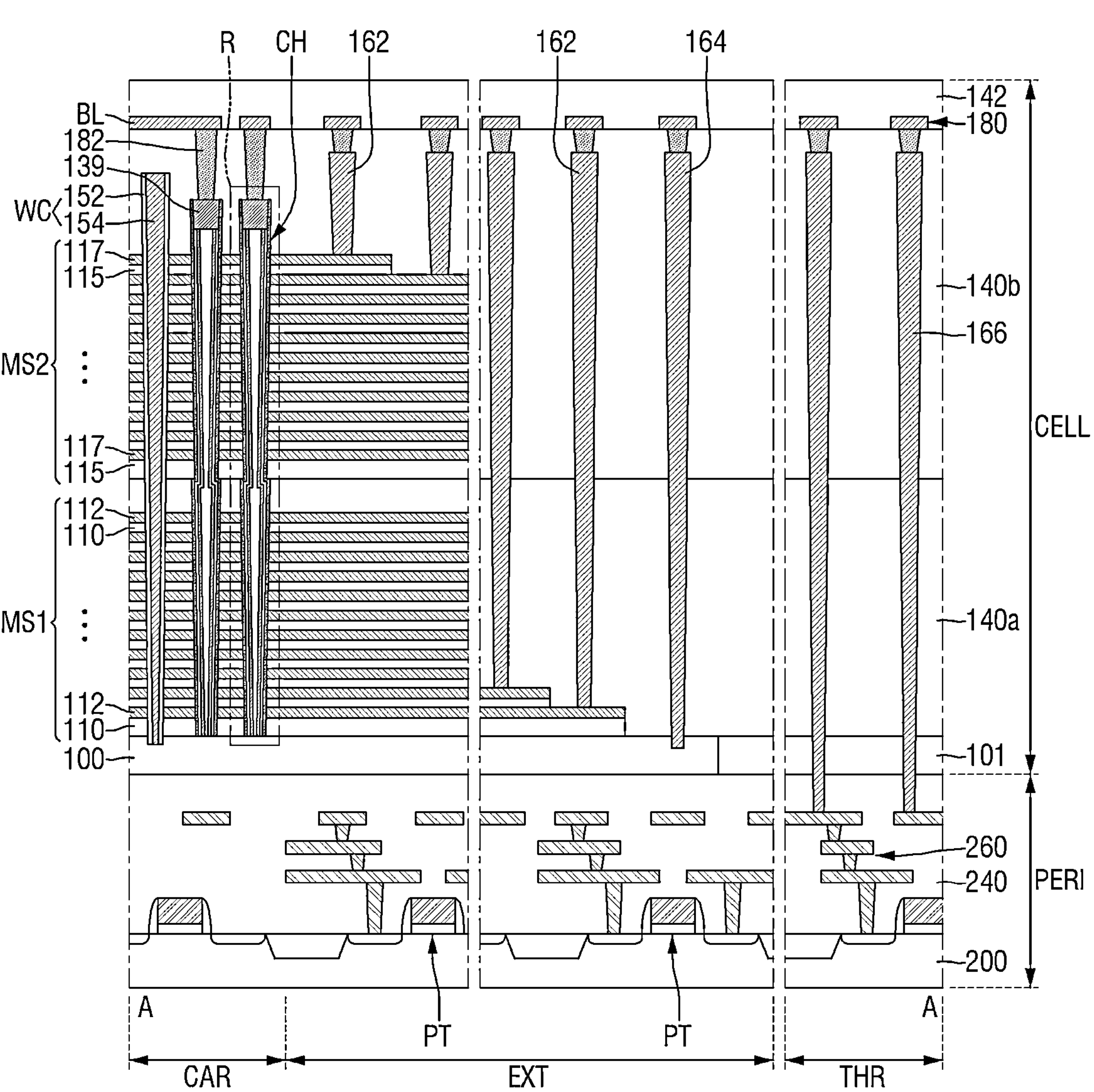
FIG. 4 is a cross-sectional view taken along a line A-A' of FIG. 3.

FIG. 3 is a schematic layout diagram for explaining a semiconductor memory device according to an example embodiment. FIG. 4 is a cross-sectional view taken along a line A-A' of FIG. 3. FIGS. 5A to 5G are various enlarged views for explaining a region R of FIG. 4.

Referring to FIGS. 3 to 5$a$, the semiconductor memory device according to an example embodiment may include a cell substrate 100. And the semiconductor memory device according to some embodiments may include a cell structure CELL and a peripheral circuit structure PERI in FIG. 4.

The cell structure CELL may include a cell substrate 100, an insulating substrate 101, mold structures MS1 and MS2, interlayer insulating films 140$a$ and 140$b$, a channel structure CH, a word line cutting region WC, a bit line BL, a gate contact 162, and a cell wiring structure 180.

The cell substrate 100 may include, for example, a semiconductor substrate such as a silicon substrate, a germanium substrate or a silicon-germanium substrate. In some example embodiments, the cell substrate 100 may include a silicon-on-insulator (SOI) substrate, a germanium-on-insulator (GOI) substrate, and the like.

In some example embodiments, the cell substrate 100 may include impurities. For example, the cell substrate 100 may include N-type impurities (e.g., phosphorus (P), arsenic (As), etc.). In the following description, the cell substrate 100 will be mainly described as an N-type, but this is merely an example, and the cell substrate 100 may, of course, be a P-type. In some example embodiments, the cell substrate 100 may include polysilicon (poly-Si) doped with N-type impurities. Such a cell substrate 100 may be provided as a common source line (e.g., CSL of FIG. 2) of the semiconductor memory device according to some example embodiments.

The cell substrate 100 may include a cell array region CAR, an extension region EXT, and a through region THR.

A memory cell array (e.g., 20 of FIG. 1) including a plurality of memory cells may be formed on the cell array region CAR. For example, a channel structure CH, gate electrodes 112 and 117, bit lines BL and the like which will be described below may be disposed on the cell array region CAR. In the following description, a surface of the cell substrate 100 on which the memory cell array is disposed may be referred to as a front side. In contrast, a surface of the cell substrate 100 opposite to the front side of the cell substrate 100 may be referred to as a back side of the cell substrate 100.

The extension region EXT may be disposed around the cell array region CAR. For example, the extension region EXT may surround the cell array region CAR from a planar viewpoint. Gate electrodes 112 and 117, which will be described below, may be stacked stepwise on the extension region EXT.

The through region THR may be disposed outside the cell array region and/or the extension region EXT, or may be disposed inside the cell array region and/or the extension region EXT. A through plug 166, which will be described below, may be disposed on the through region THR.

The insulating substrate 101 may be formed inside or through at least a part of the cell substrate 100 of the extension region EXT and/or the through region THR. The insulating substrate 101 may form an insulating region inside the cell substrate 100, in the extension region EXT and/or the through region THR. As an example, the insulating substrate 101 may replace at least a part of the cell substrate 100 of the through region THR to define an insulating region inside the through region THR. The insulating substrate 101 may include, for example, but is not limited to, at least one of silicon oxide, silicon nitride, silicon oxynitride, and silicon carbide.

The mold structures MS1 and MS2 may be formed on the cell substrate 100. The mold structures MS1 and MS2 may include a plurality of gate electrodes 112 and 117 and a plurality of mold insulating films 110 and 115 stacked on the cell substrate 100. Each of the gate electrodes 112 and 117 and each of the mold insulating films 110 and 115 may have a layered structure extending parallel to the upper side of the cell substrate 100. The gate electrodes 112 and 117 may be sequentially stacked on the cell substrate 100 while being separated from each other by the mold insulating films 110 and 115.

In some example embodiments, the mold structures MS1 and MS2 may include a plurality of stacks (e.g., a first mold stack MS1 and a second mold stack MS2) stacked sequentially on the cell substrate 100. Although the number of stacks stacked on the cell substrate 100 is only shown as being two, this is only for convenience of explanation, and it goes without saying that the number of stacks stacked on the cell substrate 100 may be three or more.

The first mold stack MS1 may include first mold insulating films 110 and first gate electrodes 112 that are alternately stacked on the cell substrate 100. In some example embodiments, the first gate electrode 112 may include at least one ground selection line (e.g., GSL of FIG. 2) and a plurality of first word lines (e.g., WL11 to WL1$n$ of FIG. 2). The number, disposition and the like of the first mold insulating film 110 and the first gate electrode 112 are merely examples, and are not limited to those shown.

The second mold stack MS2 may include second mold insulating films 115 and second gate electrodes 117 that are alternately stacked on the first mold stack MS1. In some example embodiments, the second gate electrode 117 may include a plurality of second word lines (e.g., WL21 to WL2$n$ of FIG. 2) and at least one string selection line (e.g., SSL of FIG. 2) that are stacked sequentially on the first mold stack MS1. The number, disposition, and the like of the second mold insulating film 115 and the second gate electrode 117 are merely examples, and are not limited to those shown.

The gate electrodes 112 and 117 may each include, but are not limited to, a conductive material, for example, a metal such as tungsten (W), molybdenum (Mo), ruthenium (Ru), cobalt (Co) and nickel (Ni), or a semiconductor material such as silicon. As an example, the gate electrodes 112 and 117 may each include at least one of tungsten (W), molybdenum (Mo), and ruthenium (Ru). As another example, the gate electrodes 112 and 117 may each include polysilicon.

In some example embodiments, each gate electrode 112 and 117 may include a barrier metal layer BM and a filling metal layer FM. The barrier metal layer BM may conformally extend along upper and lower sides of the mold insulating films 110 and 115 and side surfaces of the gate dielectric layer 132. The filling metal layer FM may fill the regions of the gate electrodes 112 and 117 that remain after the barrier metal layer BM is filled.

The mold insulating films 110 and 115 may each include, for example, but are not limited to, at least one of silicon oxide, silicon nitride, and silicon oxynitride. For example, the mold insulating films 110 and 115 may each include a silicon oxide film.

The interlayer insulating films 140*a* and 140*b* may be formed on the first side 100*a* of the cell substrate 100 to cover the mold structures MS1 and MS2. In some example embodiments, the interlayer insulating films 140*a* and 140*b* may include a first interlayer insulating film 140*a* and a second interlayer insulating film 140*b* that are sequentially stacked on the cell substrate 100. The first interlayer insulating film 140*a* may cover the first mold stack MS1, and the second interlayer insulating film 140*b* may cover the second mold stack MS2. The interlayer insulating films 140*a* and 140*b* may include, for example, but are not limited to, at least one of silicon oxide, silicon oxynitride, and a low dielectric constant (low-k) material having a lower dielectric constant than silicon oxide A channel structure CH may be formed on the cell array region CAR of the cell substrate 100. The channel structure CH may extend in a vertical direction (hereinafter referred to as a third direction Z) intersecting the upper side of the cell substrate 100 to penetrate the mold structures MS1 and MS2. For example, the channel structure CH may have a pillar shape (e.g., a cylindrical shape) extending in the third direction Z. Therefore, the channel structure CH may intersect the plurality of gate electrodes 112 and 117.

In some example embodiments, the channel structure CH may have a step between the first mold stack MS1 and the second mold stack MS2. For example, as shown in FIG. 4, the side surfaces of the channel structure CH may be bent at a boundary between the first mold stack MS1 and the second mold stack MS2.

The channel structure CH may include a gate dielectric layer 132, a semiconductor layer 133 and a core insulating layer 138 that are sequentially stacked on side surfaces of each gate electrode 112 and 117. For example, channel holes extending in the third direction Z and penetrating the mold structures MS1 and MS2 may be formed. The gate dielectric layer 132, the semiconductor layer 133 and the core insulating layer 138 may be sequentially stacked inside the channel hole. In some example embodiments, the gate dielectric layer 132 and the semiconductor layer 133 may each extend conformally along the profile of the channel hole. A core insulating layer 138 may fill the region of the channel hole that remains after the gate dielectric layer 132 and the semiconductor layer 133 are filled.

The gate dielectric layer 132 may be interposed between each of the gate electrodes 112 and 117 and the semiconductor layer 133. For example, the gate dielectric layer 132 may extend conformally along the outer side surface of the semiconductor layer 133. In some example embodiments, the gate dielectric layer 132 may have a hollow barrel shape (e.g., a cylindrical shape).

The gate dielectric layer 132 may comprise ferroelectrics. The ferroelectrics means a material which has a spontaneous polarization, a direction of which is changed by an external electric field. For example, the gate dielectric layer 132 may include at least one of hafnium oxide, zirconium oxide, yttrium-doped zirconium oxide, yttrium-doped hafnium oxide, magnesium-doped zirconium oxide, magnesium-doped hafnium oxide, silicon-doped hafnium oxide, silicon-doped zirconium oxide, barium-doped titanium oxide, and combinations thereof.

The semiconductor layer 133 may be interposed between the gate dielectric layer 132 and the core insulating layer 138. The semiconductor layer 133 may extend in the third direction Z and intersect the plurality of gate electrodes 112 and 117. For example, semiconductor layer 133 may extend conformally along the inner side surface of the gate dielectric layer 132. As an example, if the gate dielectric layer 132 has a cylindrical shape, the semiconductor layer 133 may also have a cylindrical shape.

One end of the semiconductor layer 133 may be electrically connected to a common source line (e.g., CSL of FIG. 2). As an example, when the cell substrate 100 is provided as a common source line, one end of the semiconductor layer 133 may be connected to the cell substrate 100. Although FIGS. 4 and 5*a* only show that the lower side of the semiconductor layer 133 is disposed on the same plane as the upper side of the cell substrate 100, this is merely an example. As another example, the lower part of the semiconductor layer 133 is buried inside the cell substrate 100, and the lower side of the semiconductor layer 133 may be disposed to be lower than the upper side of the cell substrate 100.

The semiconductor layer 133 may include an n-type channel layer 134 and a p-type channel layer 136 that extend alongside each other. The n-type channel layer 134 and the p-type channel layer 136 may each extend in the third direction Z and intersect the plurality of gate electrodes 112 and 117. Furthermore, one end of the n-type channel layer 134 and one end of the p-type channel layer 136 may each be electrically connected to the common source line (e.g., CSL of FIG. 2). In some example embodiments, the n-type channel layer 134 and the p-type channel layer 136 may be sequentially stacked on the gate dielectric layer 132. That is, the n-type channel layer 134 may be interposed between the gate dielectric layer 132 and the p-type channel layer 136.

Figure 5A:
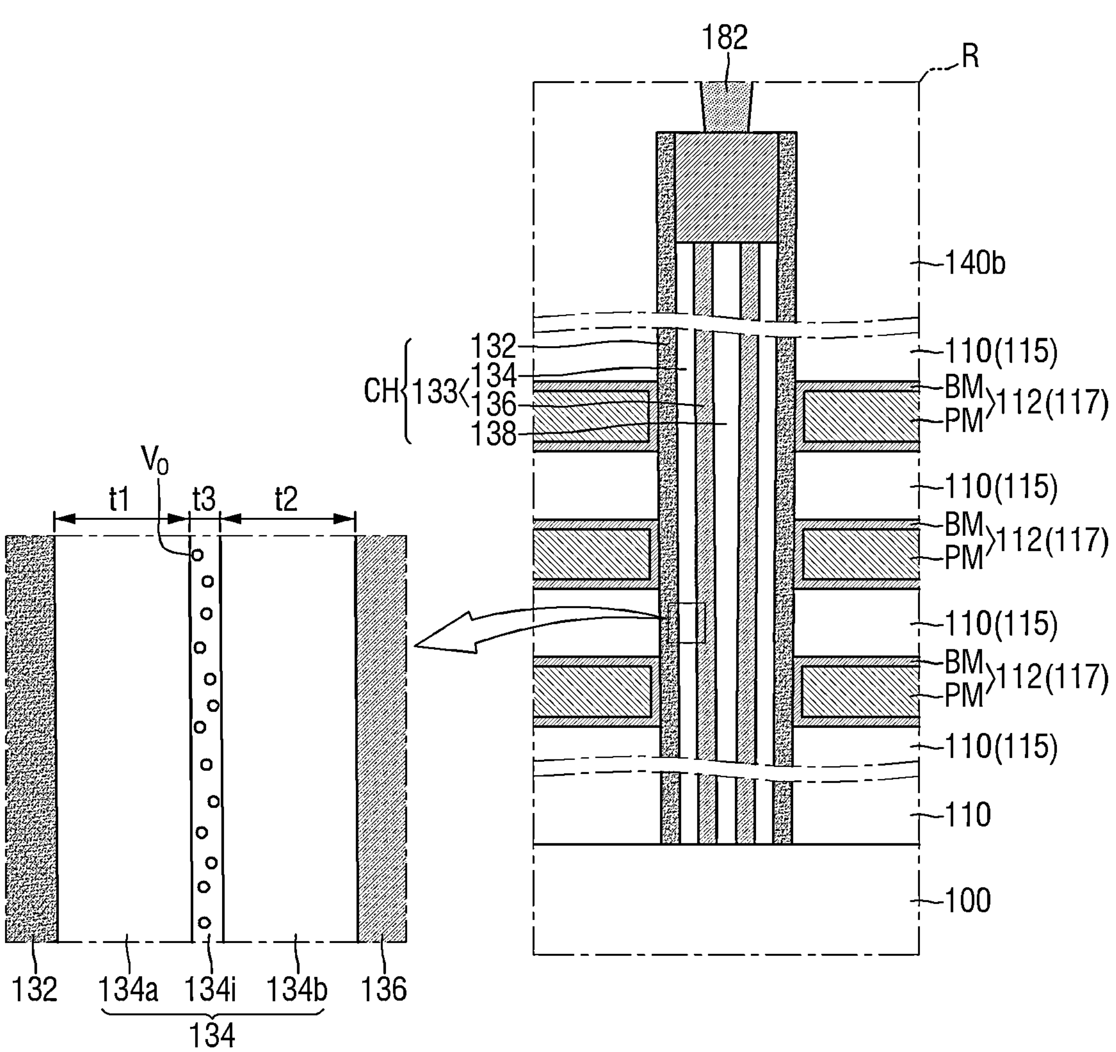
FIGS. 5A to 5G are various enlarged views for explaining a region R of FIG. 4.

The n-type channel layer 134 may include an oxide 2-dimensional electron gas (oxide 2-DEG) layer extending in the third direction Z. The oxide two-dimensional electron gas (oxide 2-DEG) refers to an electron gas of high concentration (e.g., about $1E13/cm^2$ to about $1E14/cm^2$) present in a two-dimensional form at an interface of an oxide heterostructure. For example, as shown in FIG. 5A, the n-type channel layer 134 may include a first oxide layer 134*a* and a second oxide layer 134*b* that are sequentially stacked on the gate dielectric layer 132. The oxide two-dimensional electron gas layer may be formed at the interface between the first oxide layer 134*a* and the second oxide layer 134*b*. Such an n-type channel layer 134 may be provided as the channel region in which electrons move through the oxide two-dimensional electron gas layer.

In some example embodiments, the oxide two-dimensional electron gas layer of the n-type channel layer 134 may be caused by an oxygen vacancy ($V_O$). For example, as shown in FIG. 5A, an interfacial layer 134*i* including the oxygen vacancy ($V_O$) may be formed between the first oxide layer 134*a* and the second oxide layer 134*b*. Such an interfacial layer 134*i* may be provided as the oxide two-dimensional electron gas layer of the n-type channel layer 134.

A thickness t1 of the first oxide layer 134*a* may be, for example, about 1 nm to about 10 nm. A thickness t2 of the second oxide layer 134*b* may be, for example, about 1 nm to about 10 nm. A thickness t3 of the interfacial layer 134*i* formed at the interface between the first oxide layer 134*a* and the second oxide layer 134*b* may be, for example, about 0.1 nm to about 3 nm.

The first oxide layer 134*a* may include, for example, at least one of $TiO_2$, $SrTiO_3$, $In_2O_3$, $WO_3$, ZnO, and combinations thereof. The second oxide layer 134*b* may include, for example, $Al_2O_3$. The second oxide layer 134*b* is provided between the first oxide layer 134*a* and the p-type channel layer 136. However, these are only examples, and if it is an oxide heterostructure that induces the oxide two-dimensional electron gas (oxide 2-DEG), the material constituting the first oxide layer 134*a* and the second oxide layer 134*a* is not limited.

In some example embodiments, the first oxide layer 134*a* and the second oxide layer 134*b* may each be formed by an atomic layer deposition (ATOM) process. For example, the first oxide layer 134*a* may include at least one of a $TiO_2$ film, a $SrTiO_3$ film, an $In_2O_3$ film, a $WO_3$ film, and a ZnO film formed by an atomic layer deposition process, and the second oxide layer 134*b* may include an $Al_2O_3$ film formed by the atomic layer deposition process.

In some example embodiments, the second oxide layer 134*b* may be formed on the first oxide layer 134*a* by an atomic layer deposition process that utilizes a reducing precursor. As an example, the first oxide layer 134*a* may include a $TiO_2$ film, and the second oxide layer 134*b* may include an $Al_2O_3$ film deposited on the $TiO_2$ film by the atomic layer deposition process that utilizes trimethylaluminum (TMA) as an aluminum precursor. In such a case, TMA may function as a reducing agent and efficiently induce the generation of oxygen vacancy ($V_O$) at the interface of the $TiO_2/Al_2O_3$ heterostructure. Accordingly, the oxide two-dimensional electron gas layer induced at the interface of the $TiO_2/Al_2O_3$ heterostructure is formed at a relatively high concentration (e.g., about 1E14/$cm^2$), and may enhance performance of the n-type channel layer 134.

In some example embodiments, the first oxide layer 134*a* may further include impurity elements. The impurity elements may control the concentration of oxygen vacancy ($V_O$) formed in the interfacial layer 134*i*, thereby controlling the distribution and thickness of the interfacial layer 134*i*. The n-type channel layer 134 with further enhanced performance may be provided accordingly.

When the first oxide layer 134*a* includes a $TiO_2$ film, the impurity elements that increase the concentration of oxygen vacancy ($V_O$) may include, for example, but are not limited to, carbon (C), nitrogen (N), aluminum (Al), cadmium (Cd), cobalt (Co), chromium (Cr), copper (Cu), ferric iron ($Fe^{3+}$), lithium (Li), manganese (Mn), sodium (Na), nickel (Ni), antimony (Sb), vanadium (V), zinc (Zn) or the like.

When the first oxide layer 134*a* includes a $TiO_2$ film, the impurity elements that lower the concentration of oxygen vacancy ($V_O$) may include, for example, but are not limited to, boron (B), oxygen (O), fluorine (F), phosphorus (P), sulfur(S), chlorine (Cl), gold (Au), calcium (Ca), cerium (Ce), dysprosium (Dy), europium (Eu), erbium (Er), ferrous iron ($Fe2^+$), holmium (Ho), lanthanum (La), niobium (Nb), neodymium (Nd), silicon (Si), samarium (Sm), strontium (Sr), terbium (Tb), thulium (Tm), yttrium (Y), zirconium (Zr) or the like.

The p-type channel layer 136 may be provided as a hole transfer layer extending in the third direction Z. For example, the p-type channel layer 136 may include silicon (Si) or germanium (Ge) which is an elemental semiconductor material. In some example embodiments, the p-type channel layer 136 may include a compound semiconductor material, for example, a group IV-IV compound semiconductor or a group III-V compound semiconductor. The group IV-IV compound semiconductor may be, for example, a binary compound or a ternary compound containing at least two or more of carbon (C), silicon (Si), germanium (Ge) and tin (Sn), a compound obtained by doping the elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element. The p-type channel layer 136 may include a p-type semiconductor material doped with p-type impurities or a genuine semiconductor material that is not doped with impurities.

In some example embodiments, the p-type channel layer 136 may include a two-dimensional semiconductor material or a p-type oxide semiconductor material. Such a p-type channel layer 136 may improve mobility, single channel effect (SCE) or the like to enhance the performance of the semiconductor memory device.

The two-dimensional semiconductor material may include, for example, two-dimensional chalcogenide, which include chalcogen elements. The two-dimensional chalcogen element is an element belonging to group 16 of the periodic table, and may include at least one of oxygen (O), sulfur(S), selenium (Se), tellurium (Te), polonium (Po) and livermorium (Lv).

As an example, the two-dimensional chalcogenide may include a two-dimensional chalcogenide in which a semiconductor element and a chalcogen element are combined. For example, the two-dimensional chalcogenide may include at least one of silicon sulfide ($Si_2S_3$), silicon selenide ($Si_2Se_3$), silicon telluride ($Si_2Te_3$), germanium sulfide ($Ge_2S_3$), germanium selenide ($Ge_2Se_3$), germanium telluride ($Ge_2Se_3$), and combinations thereof.

As another example, the two-dimensional chalcogenide may include a transition metal dichalcogenide (TMD). The transition metal dichalcogenide (TMD) may include, for example, one transition metal element among Mo, W, Nb, V, Ta, Ti, Zr, Hf, Tc, Re, Cu, Ga, In, Sn, Ge, and Pb element, and one chalcogen element among S, Se, and Te.

The p-type oxide semiconductor material may include, for example, but is not limited to, at least one of copper oxide (CuO), tin oxide (SnO), and nickel oxide (NiO).

In some example embodiments, the p-type channel layer 136 may include at least one of a two-dimensional semiconductor material such as $Si_2Te_3$, $\beta$-$TeO_2$ and $WSe_2$, a p-type oxide semiconductor material such as NiO, $Cu_2O$, CuO, SnO, $CuAlO_2$, and $CuCrO_2$, and combinations thereof.

A core insulating layer 138 may fill the region above the semiconductor layer 133. The core insulation layer 138 may have, for example, a pillar shape. As an example, the core insulating layer 138 may have a cylindrical shape that fills the interior of the cylindrical semiconductor layer 133. The core insulating layer 138 may include, for example, but is not limited to, at least one of silicon oxide, silicon nitride, and silicon oxynitride. As an example, the core insulation layer 138 may include silicon oxide.

In some example embodiments, the plurality of channel structures CH may be arranged in the form of a zigzag. For example, as shown in FIG. 3, the plurality of channel structures CH may be arranged alternately in the first direction X and the second direction Y. Such a channel structure CH may further improve the degree of integration of the semiconductor memory device. The number, disposition, and the like of the channel structures CH are merely example and are not limited to those shown. In some other example embodiments, the plurality of channel structures CH may be arranged in the form of honeycomb.

The word line cutting region WC may extend in the first direction X to cut the mold structures MS1 and MS2. The mold structures MS1 and MS2 may be divided by the word line cutting regions WC to form a plurality of memory cell blocks (e.g., BLK1 to BLKn of FIG. 1). The plurality of word line cutting regions WC may be arranged two-dimensionally in a plane including the first direction X and the second direction Y. For example, the word line cutting regions WC each extend in the first direction X, are spaced apart from each other and may be arranged along the second direction Y.

The word line cutting region WC may include an insulating material, for example, but is not limited to, at least one of silicon oxide, silicon nitride and silicon oxynitride.

In some example embodiments, the word line cutting region WC may include an insulating spacer 152 and a first substrate contact 154.

The first substrate contact 154 may be connected to the cell substrate 100. For example, the first substrate contact 154 may extend in the third direction Z, penetrate the mold structures MS1 and MS2, and be connected to the cell substrate 100. In some other example embodiments, the first substrate contact 154 may be omitted.

The insulating spacer 152 may extend along the side surface of the first substrate contact 154. The insulating spacer 152 may include an insulating material, for example, but is not limited to, at least one of silicon oxide, aluminum oxide, tantalum oxide, and combinations thereof. Such an insulating spacer 152 may electrically isolate the first substrate contact 154 from each of the gate electrodes 112 and 117.

The bit line BL may be formed on the mold structures MS1 and MS2. The plurality of bit lines BL may be arranged two-dimensionally inside a plane including the first direction X and the second direction Y. For example, the bit lines BL each extend in the second direction Y, are spaced apart from each other, and may be arranged along the first direction X.

The bit line BL may extend in the second direction Y and may be connected to a plurality of channel structures CH arranged along the second direction Y. For example, a channel pad 139 connected to the channel structure CH may be formed on the channel structure CH. Also, a bit line contact 182 connected to the channel pad 139 may be formed in the second interlayer insulating film 140*b*. The bit line BL may be electrically connected to the channel structures CH through the channel pad 139 and the bit line contact 182.

The other end of the semiconductor layer 133 may be electrically connected to the bit line BL. For example, the channel pad 139 may be connected to the upper side of the semiconductor layer 133, as shown in FIG. 5A. Accordingly, the semiconductor layer 133 may electrically connect the common source line (e.g., CSL of FIG. 2) and the bit line BL. As an example, when the cell substrate 100 is provided as a common source line, the semiconductor layer 133 may electrically connect the cell substrate 100 and the bit line BL.

Although the gate dielectric layer 132 is only shown to extend along the side surface of the channel pad 139, this is example only. As another example, the channel pad 139 may be connected to the upper side of the gate dielectric layer 132.

The gate contact 162 may be connected to each of the gate electrodes 112 and 117. For example, the gate electrodes 112 and 117 may be stacked stepwise on the extension region EXT. A plurality of gate contacts 162 may extend in the third direction Z to penetrate the interlayer insulating films 140*a* and 140*b*, and may be connected to the corresponding gate electrodes 112 and 117 on the extension region EXT.

A cell wiring structure 180 may be formed on the mold structures MS1 and MS2. For example, a first inter-wiring insulating film 142 may be formed on the second inter-wiring insulating film 140*b*, and the cell wiring structure 180 may be formed in the first inter-wiring insulating film 142. The cell wiring structure 180 may be electrically connected to the bit lines BL, the gate contacts 162 and/or the first substrate contact 154. Accordingly, the cell wiring structure 180 may be electrically connected to the channel structure CH, the gate electrodes 112 and 117 and/or the cell substrate 100. The number of layers, disposition, or the like of the shown cell wiring structure 180 are merely examples, and are not limited thereto.

In some example embodiments, a second substrate contact 164 that connects the cell substrate 100 and the cell wiring structure 180 may be formed. The second substrate contact 164 may, for example, extend in the third direction Z to penetrate the interlayer insulating films 140*a* and 140*b*, and may electrically connect the cell substrate 100 and the cell wiring structure 180. In some other example embodiments, the second substrate contact 164 may be omitted.

The semiconductor memory device according to some example embodiments may store information, using varying polarized states of a gate dielectric layer 132, which includes ferroelectrics. For example, the changing polarized state of the gate dielectric layer 132 may be used to perform a write operation or an erase operation. As an example, a voltage may be applied to the gate dielectric layer 132 such that a positive charge appears on the side opposite to the semiconductor layer 133 at the time of the write operation. Further, the voltage may be applied to the gate dielectric layer 132 such that a negative charge appears on the side opposite to the semiconductor layer 133 at the time of the erase operation.

In this way, as the polarized direction of the gate dielectric layer 132 changes, a threshold voltage of a transistor that includes the gate dielectric layer 132 may change, which may constitute a memory cell that stores information. As an example, the threshold voltage of a transistor including the gate dielectric layer 132 may decrease due to the write operation, and may increase due to the erase operation. Therefore, when a desired (or alternatively, predetermined) voltage is applied to the gate electrodes 112 and 117 at the time of the read operation, the transistor may be turned on or off depending on the polarized direction of the gate dielectric layer 132. As an example, when the gate dielectric layer 132 is in a written state, the transistor including the gate dielectric layer 132 is turned on and a current (or electrons) may flow through the n-type channel layer 134. In contrast, when the gate dielectric layer 132 is in an erase state, the transistor including the gate dielectric layer 132 is turned off and no current (or electrons) may flow through the n-type channel layer 134. The information stored in the gate dielectric layer 132 may be read accordingly.

In some example embodiments, the p-type channel layer 136 may be provided as a hole transfer layer to perform the erase operation. As an example, when a high voltage is applied to the cell substrate 100 through the first substrate contact 154 and/or the second substrate contact 164, holes may be supplied to the p-type channel layer 136. Accordingly, the polarized direction of the gate dielectric layer 132 may be induced such that a negative charge appears on the side opposite to the semiconductor layer 133 and the erase operation may be performed. However, this is example only, and the holes supplied to the p-type channel layer 136 may be generated by a gate induced drain leakage (GIDL).

The peripheral circuit structure PERI may include a peripheral circuit board 200, a peripheral circuit element PT, and a peripheral circuit wiring structure 260.

The peripheral circuit substrate 200 may include a semiconductor substrate such as, for example, a silicon substrate, a germanium substrate or a silicon-germanium substrate. In some example embodiment, the peripheral circuit substrate 200 may include a Silicon-On-Insulator (SOI) substrate or a Germanium-On-Insulator (GOI) substrate.

The peripheral circuit element PT may be formed on the peripheral circuit board 200. The peripheral circuit element PT may constitute a peripheral circuit (e.g., 30 of FIG. 1) that controls the operation of the semiconductor memory device. For example, the peripheral circuit element PT may include a control logic (e.g., 37 of FIG. 1), a row decoder (e.g., 33 of FIG. 1), a page buffer (e.g., 35 of FIG. 1), and the like. In the following description, a surface of the peripheral circuit board 200 on which the peripheral circuit elements PT are disposed may be called a front side of the peripheral circuit board 200. In contrast, a surface of the peripheral circuit board 200 opposite to the front side of the peripheral circuit board 200 may be called a back side of the peripheral circuit board 200.

The peripheral circuit element PT may include, for example, but is not limited to, a transistor. For example, the peripheral circuit element PT may include not only various active elements such as a transistor, but also various passive elements such as a capacitor, a resistor and an inductor.

The peripheral circuit wiring structure 260 may be formed on the peripheral circuit element PT. For example, the second inter-wiring insulating film 240 may be formed on the front side of the peripheral circuit substrate 200, and the peripheral circuit wiring structure 260 may be formed inside the second inter-wiring insulating film 240. The peripheral circuit wiring structure 260 may be electrically connected to the peripheral circuit element PT. The number of layers, disposition, and the like of the shown peripheral circuit wiring structure 260 are merely examples, and are not limited thereto.

In some example embodiments, the cell structure CELL may be stacked on the peripheral circuit structure PERI. For example, the cell structure CELL may be stacked on the second inter-wiring insulating film 240.

In some example embodiments, a through plug 166 that connects the cell wiring structure 180 and the peripheral circuit wiring structure 260 may be formed. The through plug 166 may be formed on the through region THR. The through plug 166 may extend, for example, in the third direction Z and penetrate the second interlayer insulating film 140*b*, the first interlayer insulating film 140*a*, and the insulating substrate 101. The cell wiring structure 180 may be electrically connected to the peripheral circuit wiring structure 260 through the through plug 166. Accordingly, the bit line BL, the gate electrodes 112 and 117 and/or the cell substrate 100 may be electrically connected to the peripheral circuit element PT.

Research for improving performance by applying the properties of ferroelectrics to the semiconductor device is continuously conducted. For example, a semiconductor memory device in which memory cells for storing information using varying polarized states of ferroelectrics are arranged three-dimensionally is proposed. However, in the case of a semiconductor memory device using an existing semiconductor material such as polysilicon (poly-Si) as a channel layer, an interfacial layer (e.g., a silicon oxide film) formed at the interface between a ferroelectric layer and a semiconductor layer becomes a cause that degrades the properties of the semiconductor memory device. For example, an endurance of the semiconductor memory device may be deteriorated by an interface trap due to the interfacial layer.

In contrast, the semiconductor memory device according to some example embodiments may have improved properties, by utilizing the semiconductor layer 133 including an oxide two-dimensional electron gas (oxide 2-DEG) layer as a channel region. For example, as explained above, the n-type channel layer 134 of the semiconductor layer 133 may include an interfacial layer 134*i* that provides the oxide two-dimensional electron gas (oxide 2-DEG) layer due to oxygen vacancy ($V_O$) at the interface between the first oxide layer 134*a* and the second oxide layer 134*b*. Accordingly, deterioration of the endurance of the semiconductor memory device due to the interface trap may be improved, and a semiconductor memory device with improved characteristics may be provided. In addition, the oxide two-dimensional electron gas (oxide 2-DEG) layer may have improved contact resistance, because it has a higher electron concentration compared to the two-dimensional chalcogenide such as $MoS_2$.

Additionally, in some example embodiments, the n-type channel layer 134 may be provided as a high dielectric constant (high-k) film due to a $TiO_2/Al_2O_3$ heterostructure to induce an oxide two-dimensional electron gas (oxide 2-DEG) layer. Accordingly, it is possible to provide a semiconductor memory device that may perform a low voltage operation and has further improved characteristics.

FIGS. 5B to 5G are other various enlarged views for explaining a region R of FIG. 4. For convenience of explanation, repeated parts of contents explained above using FIGS. 1 to 5*a* will be briefly explained or omitted.

Figure 5B:
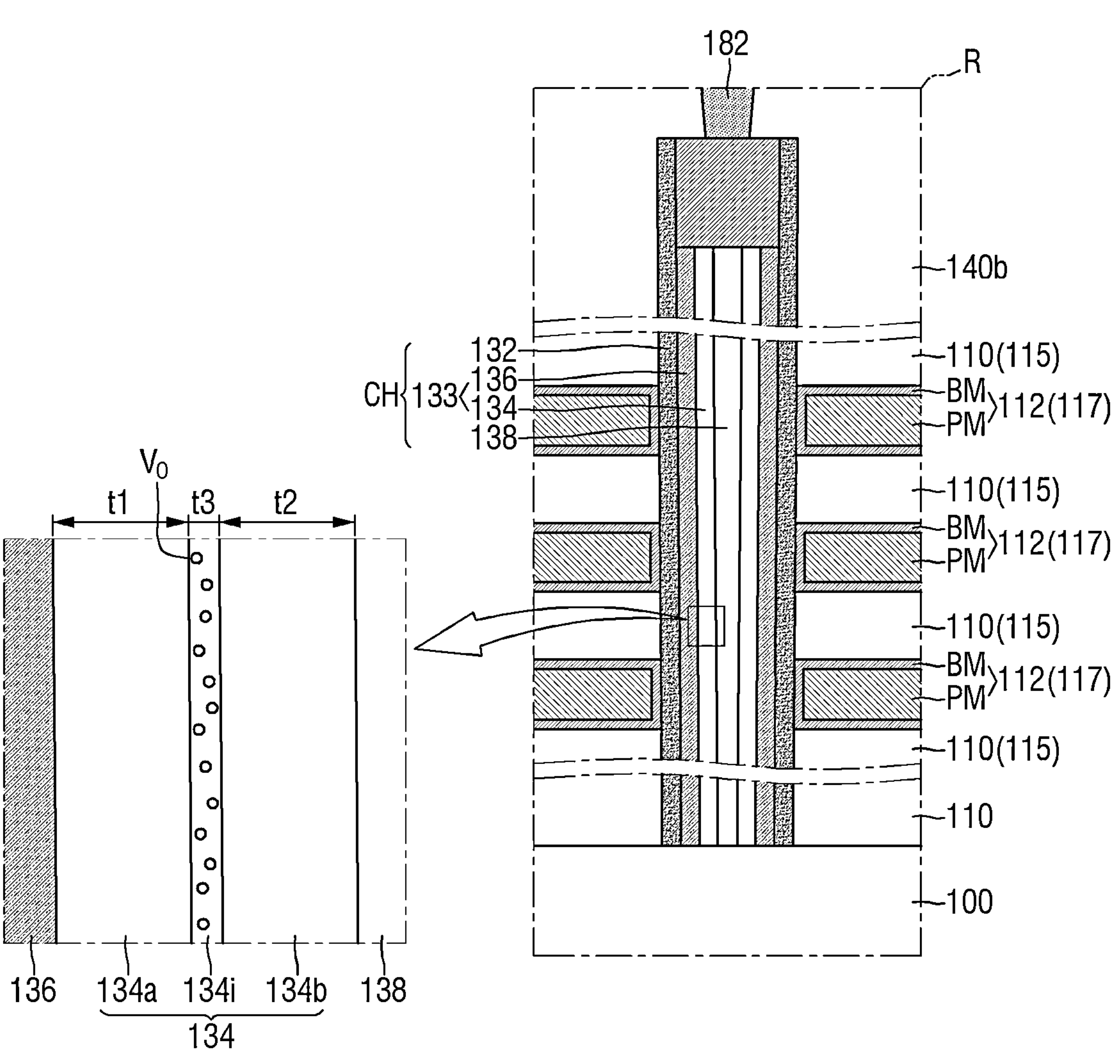

Referring to FIGS. 4 and 5B, in the semiconductor memory device according to an example embodiment, a p-type channel layer 136 and an n-type channel layer 134 are sequentially stacked on the gate dielectric layer 132. That is, the p-type channel layer 136 may be interposed between the gate dielectric layer 132 and the n-type channel layer 134. The second oxide layer 134*b* is provided between the first oxide layer 134*a* and the core insulting layer 138.

The n-type channel layer 134 may include a first oxide layer 134*a* and a second oxide layer 134*b* that are sequentially stacked on the p-type channel layer 136. The oxide two-dimensional electron gas layer of the n-type channel layer 134 may be formed at the interface between the first oxide layer 134*a* and the second oxide layer 134*b*. For example, the interfacial layer 134*i* including the oxygen vacancy ($V_O$) may be formed between the first oxide layer 134*a* and the second oxide layer 134*b*.

Figure 5C:
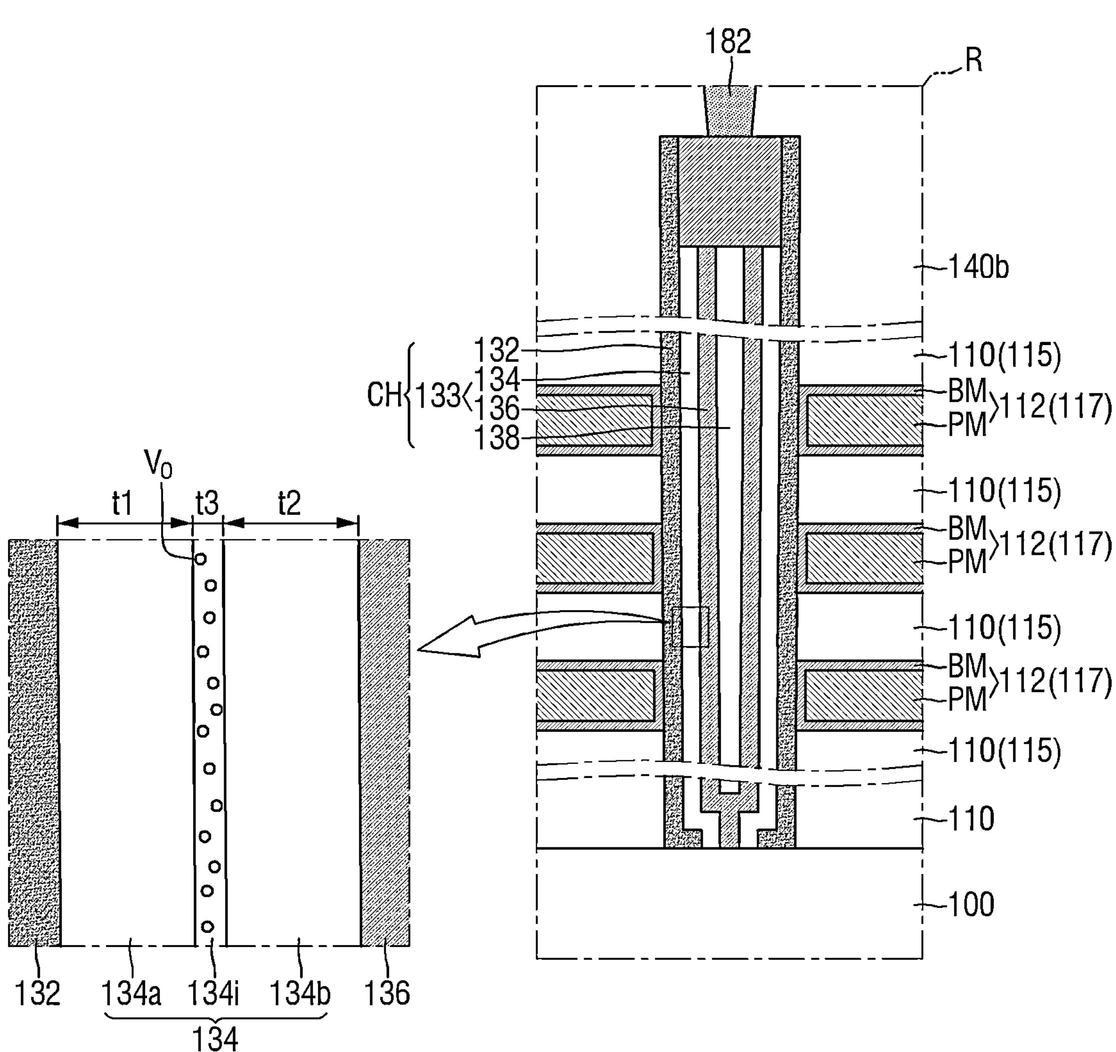

Referring to FIGS. 4 and 5C, in the semiconductor memory device according to an example embodiment, a part of the gate dielectric layer 132 extends along the upper side of the cell substrate 100.

For example, the lower part of the gate dielectric layer 132 may have an "L" shape. The semiconductor layer 133 penetrates the gate dielectric layer 132, and may be connected to the cell substrate 100. For example, the semiconductor layer 133 may conformally extend along the profile of the gate dielectric layer 132 and the profile of the upper side of the cell substrate 100 exposed from the gate dielectric layer 132.

In some example embodiments, the p-type channel layer 136 may be stacked on the n-type channel layer 134. In this case, the p-type channel layer 136 penetrates the n-type channel layer 134 and may be connected to the cell substrate 100. For example, the p-type channel layer 136 may conformally extend along the profile of the n-type channel layer 134 and the profile of the upper side of the cell substrate 100 exposed from the n-type channel layer 134. Unlike the shown example, the n-type channel layer 134 may be stacked on the p-type channel layer 136 as explained above using FIG. 5B. In this case, the n-type channel layer 134 penetrates the p-type channel layer 136, and may be connected to the cell substrate 100.

Figure 5D:
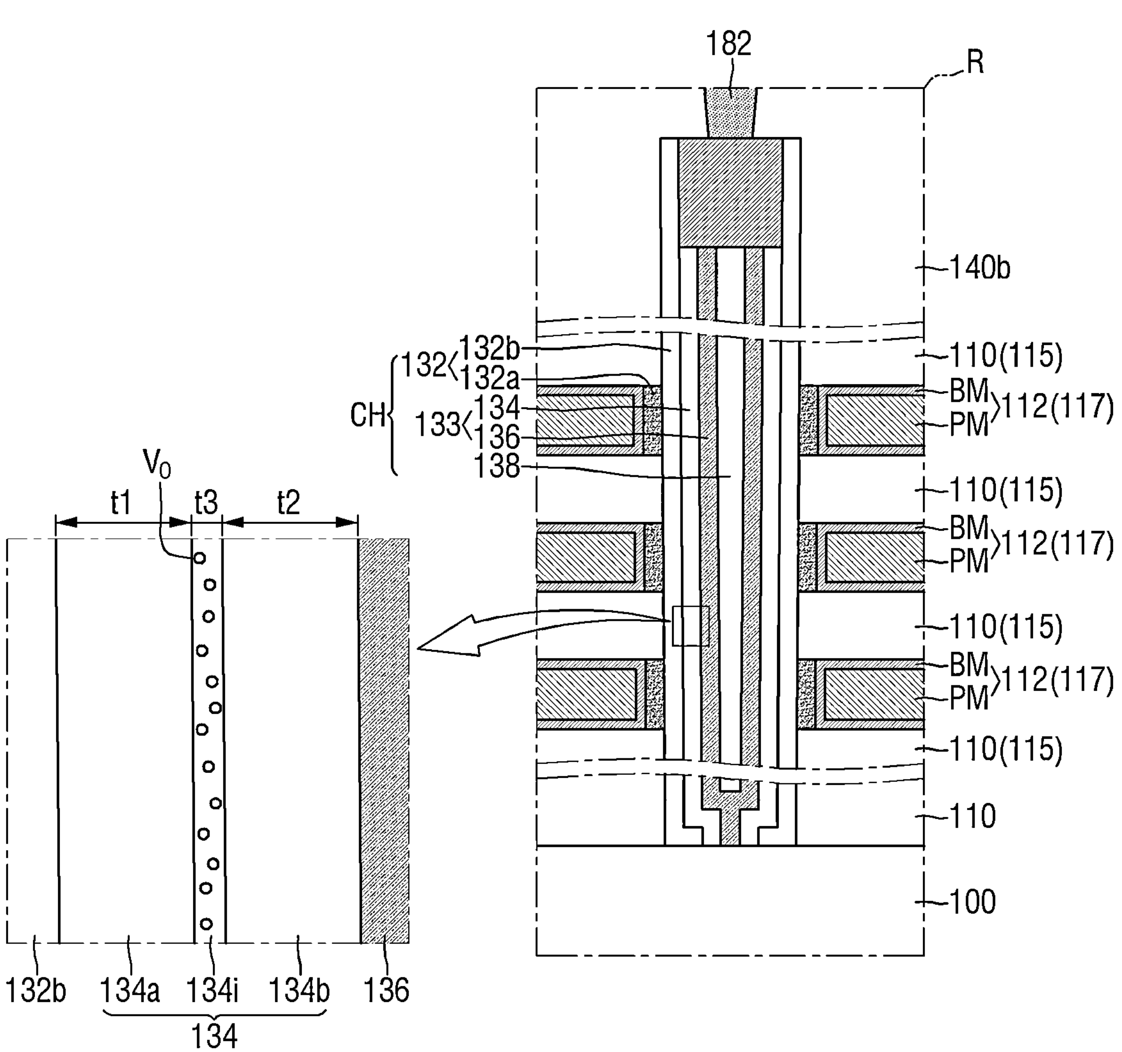

Referring to FIGS. 4 and 5D, in the semiconductor memory device according to an example embodiment, the gate dielectric layer 132 includes a ferroelectric layer 132*a* and an antiferroelectric layer 132*b*. The ferroelectric layer 132*a* and the antiferroelectric layer 132*b* may be sequentially stacked on the side surfaces of the respective gate electrodes 112 and 117.

The ferroelectric layer 132*a* may include ferroelectrics. For example, the ferroelectric layer 132*a* may include at least one of hafnium oxide, zirconium oxide, yttrium-doped zirconium oxide, yttrium-doped hafnium oxide, magnesium-doped zirconium oxide, silicon-doped hafnium oxide, silicon-doped zirconium oxide, barium-doped titanium oxide, and combinations thereof.

The antiferroelectric layer 132*b* may include antiferroelectrics. The antiferroelectrics means a material that does not have spontaneous polarization in the absence of applied external electric field, but changes a direction of polarization when an external electric field is applied, like the ferroelectrics. For example, the antiferroelectric layer 132*b* may include, but is not limited to, $PbZrO_3$ or the like.

In some example embodiments, the gate dielectric layer 132 may include a plurality of ferroelectric layers 132*a* corresponding to a plurality of gate electrodes 112 and 117, respectively. For example, the ferroelectric layers 132*a* may be interposed between the respective gate electrodes 112 and 117 and the antiferroelectric layer 132*b*, and may be separated from each other by the mold insulating films 110 and 115. Such a discontinuous ferroelectric layer 132*a* may improve performance of the semiconductor memory device by reducing a disturbance between the memory cells.

In some example embodiments, the antiferroelectric layer 132*b* may extend in the third direction Z to intersect the plurality of gate electrodes 112 and 117. That is, the antiferroelectric layer 132*b* may extend continuously in the third direction Z, unlike the discontinuous ferroelectric layer 132*a*.

Figure 5E:
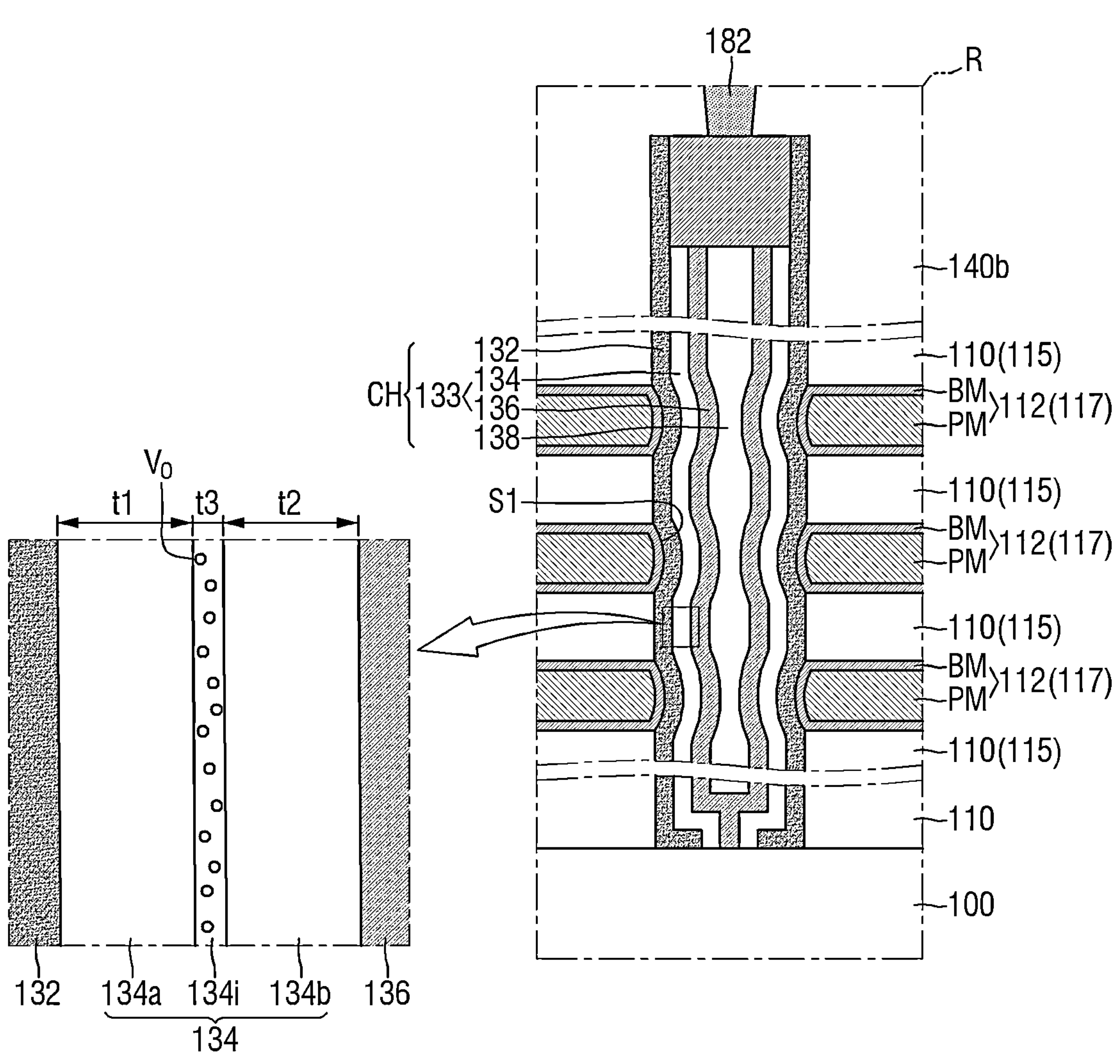

Referring to FIGS. 4 and 5E, in the semiconductor memory device according to an example embodiment, the gate electrodes 112 and 117 may protrude beyond the mold insulating films 110 and 115 toward the channel structure CH.

For example, each of the gate electrodes 112 and 117 may include a first side surface S1 protruding beyond the mold insulating films 110 and 115. In some example embodiments, the first side surface S1 may include a convex face that is convex toward the channel structure CH. The gate dielectric layer 132, the semiconductor layer 133 and the core insulating layer 138 may be sequentially stacked on the side surfaces of the mold insulating films 110 and 115 and the side surfaces of the gate electrodes 112 and 117. If the first side surface S1 includes the convex face, a part of the gate dielectric layer 132 may conformally extend along the profile of the convex surface. In this case, a contact area between the respective gate electrodes 112 and 117 and the gate dielectric layer 132 is improved, and a charge tunneling phenomenon caused by the gate dielectric layer 132 at the time of the write operation may be reduced.

Figure 5F:
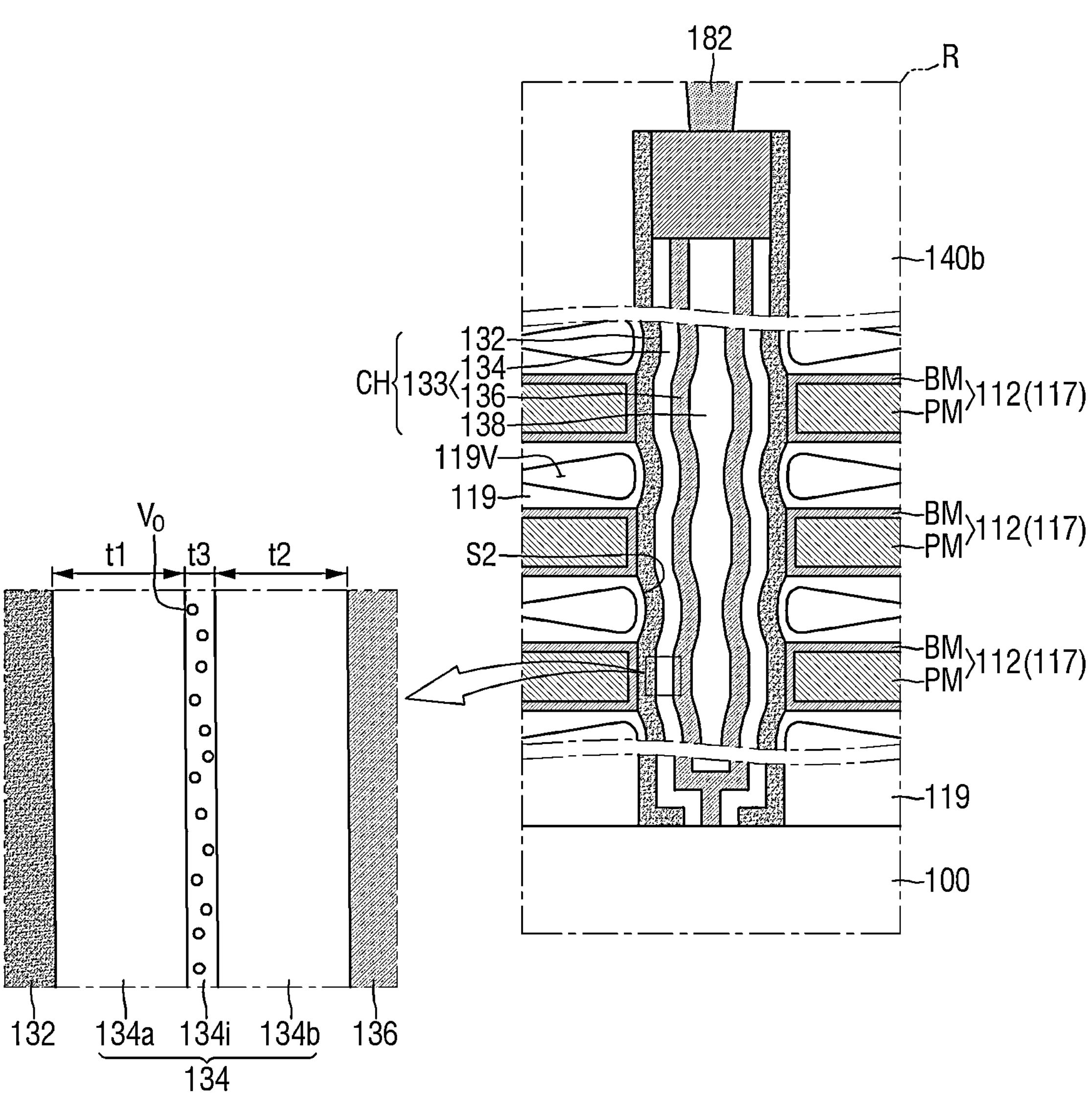

Referring to FIGS. 4 and 5F, the semiconductor memory device according to an example embodiment includes a void 119V interposed between the stacked gate electrodes 112 and 117.

The gate electrodes 112 and 117 are separated from each other by the void 119V, and may be sequentially stacked on the cell substrate 100. The void 119V may be, for example, an air gap. For example, the mold insulating films 110 and 115 may be removed, and a sealing insulating film 119 with poor step coverage may be deposited in the region from which the mold insulating films 110 and 115 are removed. Therefore, the sealing insulating film 119 including the void 119V may be formed inside. Because the void 119V may have a lower dielectric constant than the mold insulating films 110 and 115, which include silicon oxide film or the like, it is possible to enhance the performance of the semiconductor memory device by reducing the disturbance between the memory cells.

In some example embodiments, the sealing insulating film 119 may include a second side surface S2 that protrudes beyond the gate electrodes 112 and 117. In some example embodiments, the second side surface S2 may include a convex face that is convex toward the channel structure CH. The gate dielectric layer 132, the semiconductor layer 133 and the core insulating layer 138 may be sequentially stacked on the side surfaces of the mold insulating films 110 and 115 and the side surfaces of the gate electrodes 112 and 117. If the second side surface S2 includes a convex face, a part of the gate dielectric layer 132 may conformally extend along the profile of the convex face.

Figure 5G:
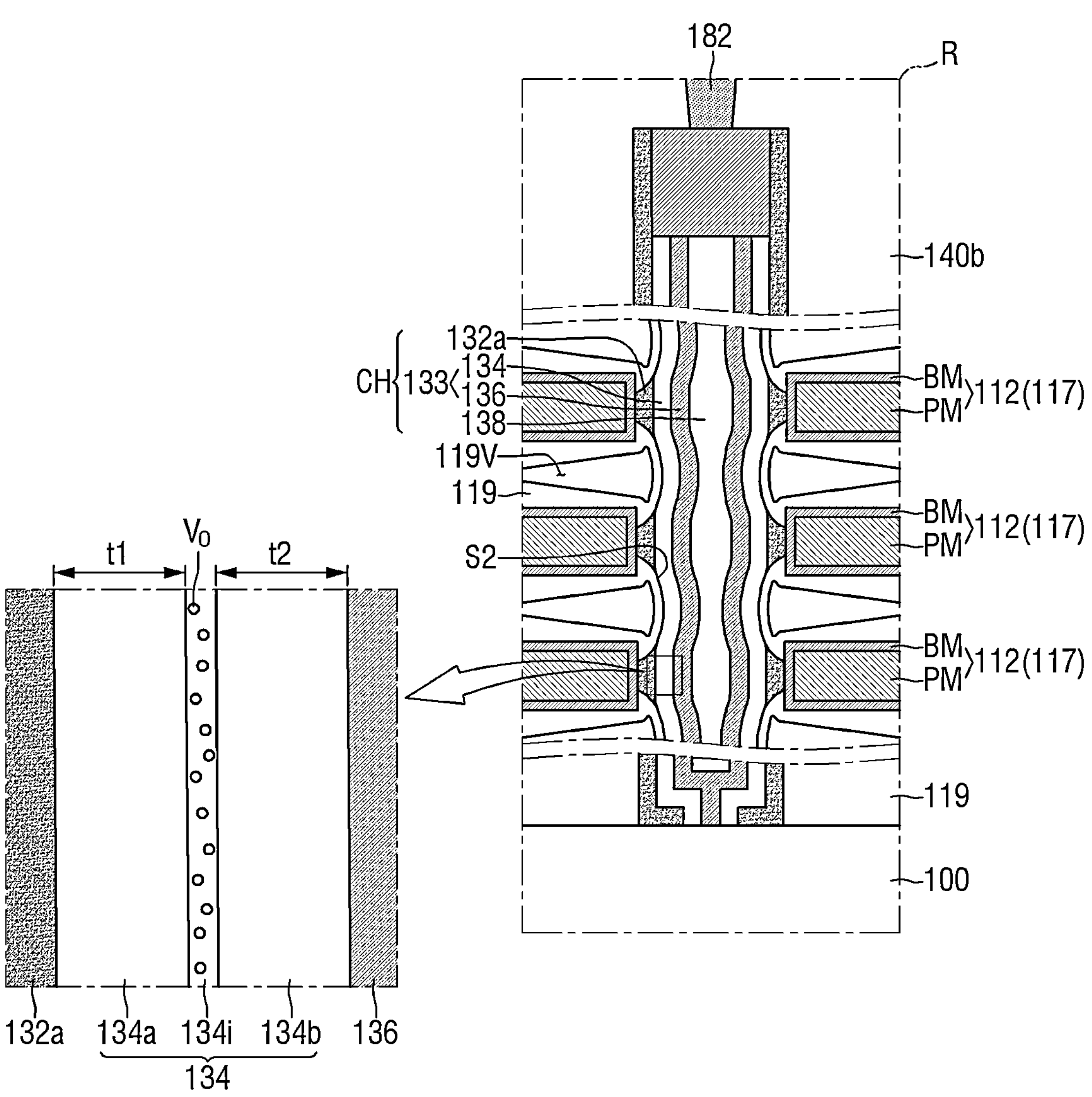

Referring to FIGS. 4 and 5G, in the semiconductor memory device according to an example embodiment, the gate dielectric layer 132 includes a plurality of ferroelectric layers 132*a* corresponding to the plurality of gate electrodes 112 and 117.

For example, the ferroelectric layer 132*a* is interposed between the respective gate electrodes 112 and 117 and the semiconductor layer 133, and may be separated from each other by the sealing insulating film 119. Such a discontinuous ferroelectric layer 132*a* may further enhance the performance of the semiconductor memory device by further reducing the disturbance between the memory cells.

Figure 6:
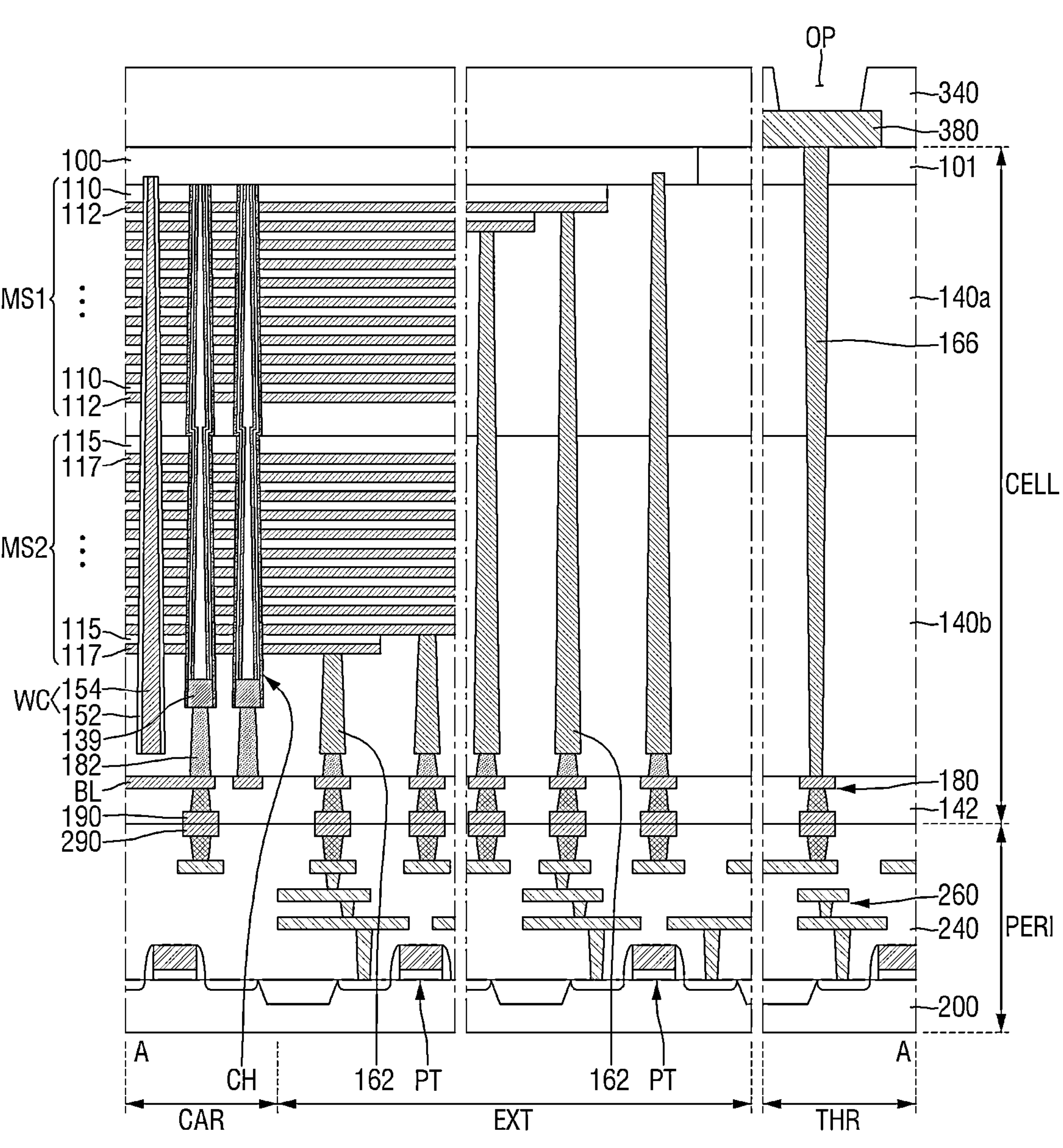
FIG. 6 is a cross-sectional view for explaining a semiconductor memory device according to an example embodiment.

FIG. 6 is a cross-sectional view for explaining a semiconductor memory device according to an example embodiment. For convenience of explanation, repeated parts of contents explained above using FIGS. 1 to 5F will be briefly explained or omitted.

Referring to FIG. 6, the front side of the cell substrate 100 is opposite to the front side of the peripheral circuit board 200 in the semiconductor memory device according to an example embodiment.

The semiconductor memory device according to some example embodiments may have a C2C (chip to chip) structure. The C2C structure may mean a structure in which an upper chip including a cell structure CELL is fabricated on a first wafer (e.g., the cell substrate 100) and a lower chip including a peripheral circuit structure PERI is fabricated on a second wafer (e.g., the peripheral circuit board 200) different from the first wafer, and then, the upper chip and the lower chip are connected to each other by a bonding way.

As an example, the bonding way may mean a way of electrically connecting a first bonding metal 190 formed on the uppermost metal layer of the upper chip and a second bonding metal 290 formed on the uppermost metal layer of the lower chip. For example, when the first bonding metal 190 and the second bonding metal 290 are formed of copper (Cu), the bonding way may be a Cu—Cu bonding way.

However, this is only an example, and the first bonding metal 190 and the second bonding metal 290 may, of course, be formed of various other metals such as aluminum (Al) or tungsten (W).

As the first bonding metal 190 and the second bonding metal 290 are bonded, the cell wiring structure 180 may be connected to the peripheral circuit wiring structure 260. Therefore, the bit line BL, the gate electrodes 112 and 117 and/or the cell substrate 100 may be electrically connected to the peripheral circuit element PT.

In some example embodiments, an I/O wiring structure 380 may be formed on the back side of the cell substrate 100. The number of layers, disposition, and the like of the shown I/O wiring structure 380 are merely examples, and are not limited thereto. The I/O wiring structure 380 may be electrically connected to the cell structure CELL and/or the peripheral circuit structure PERI.

In some example embodiments, a through plug 166 which connects the cell wiring structure 180 and the I/O wiring structure 380 may be formed. The through plug 166 may be formed on the through region THR. The through plug 166 may extend, for example, in the third direction Z and penetrate the third interlayer insulating film 340, the insulating substrate 101, the first interlayer insulating film 140*a* and the second interlayer insulating film 140*b*. The cell wiring structure 180 may be electrically connected to the I/O wiring structure 380 through the through plug 166.

In some example embodiments, a capping insulating film (not shown) that covers the I/O wiring structure 380 may be formed. The capping insulating film may include, for example, a pad opening OP that exposes a part of the I/O wiring structure 380. A part of the I/O wiring structure 380 exposed by the pad opening OP may be provided as an I/O pad.

A method for fabricating a semiconductor memory device according to an example embodiment will be described below with reference to FIGS. 1 to 26.

FIGS. 7 to 18 are intermediate step diagrams for explaining the method for fabricating the semiconductor memory device according to an example embodiment. For convenience of explanation, repeated parts of contents explained above using FIGS. 1 to 6 will be briefly explained or omitted.

Figure 7:
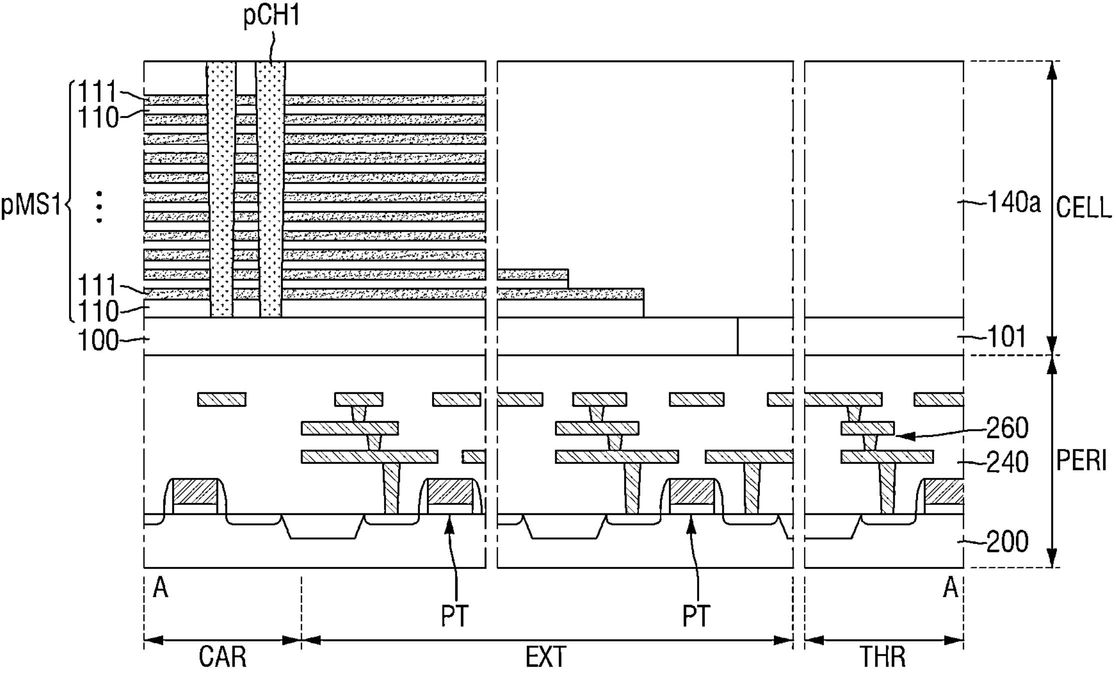
FIGS. 7 to 18 are intermediate step diagrams for explaining a method for fabricating the semiconductor memory device according to an example embodiment.

Referring to FIG. 7, a first preliminary mold pMS1 and a first preliminary channel pCH1 are formed on the cell substrate 100.

The first preliminary mold pMS1 may be formed on the front side of the cell substrate 100. The first preliminary mold pMS1 may include a plurality of first mold insulating films 110 and a plurality of first mold sacrificial films 111 that are alternately stacked on the cell substrate 100. The first mold sacrificial films 111 may include a material having an etching selectivity with respect to the first mold insulating films 110. For example, the first mold insulating films 110 may include a silicon oxide film, and the first mold sacrificial film 111 may include a silicon nitride film.

The first preliminary mold pMS1 on the extension region EXT may be patterned stepwise. Thus, the first preliminary mold pMS1 may be stacked stepwise.

The first preliminary channel pCH1 may penetrate the first preliminary mold pMS1 on the cell array region CA. Also, the first preliminary channel pCH1 may be connected to the cell substrate 100. For example, a first interlayer insulating film 140*a* that covers the first preliminary mold pMS1 may be formed on the cell substrate 100. The first preliminary channel pCH1 may penetrate the first interlayer insulating film 140*a* and the first preliminary channel pCH1 and be connected to the cell substrate 100.

The first preliminary channel pCH1 may include a material having an etching selectivity with respect to the first mold insulating film 110 and the first mold sacrificial film 111. As an example, the first preliminary channel pCH1 may include polysilicon (poly Si).

In some example embodiments, the cell substrate 100 may be stacked on the peripheral circuit structure PERI. For example, the cell substrate 100 may be stacked on the second inter-wiring insulating film 240.

Figure 8:
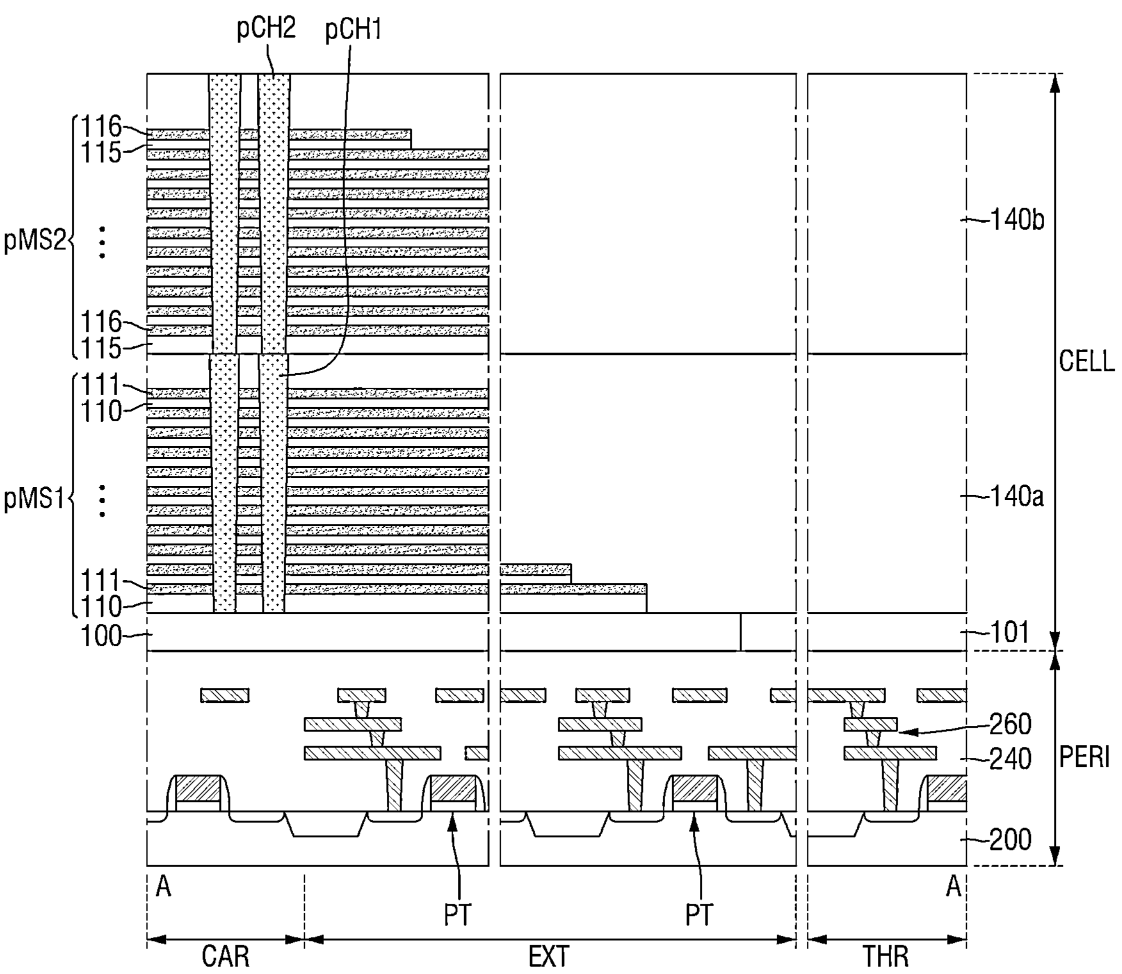

Referring to FIG. 8, a second preliminary mold pMS2 and a second preliminary channel pCH2 are formed on the first preliminary mold pMS1.

The second preliminary mold pMS2 may include a plurality of second mold insulating films 115 and a plurality of second mold sacrificial films 116 that are alternately stacked on the first preliminary mold pMS1. Because formation of the second preliminary mold pMS2 may be similar to formation of the first preliminary mold pMS1, a detailed description thereof will not be provided below.

The second preliminary channel pCH2 may penetrate the second preliminary mold pMS2 on the cell array region CA. Further, the second preliminary channel pCH2 may be connected to the first preliminary channel pCH1. Because the formation of the second preliminary channel pCH2 may be similar to the formation of the first preliminary channel pCH1, a detailed description thereof will not be provided below.

Figure 9:
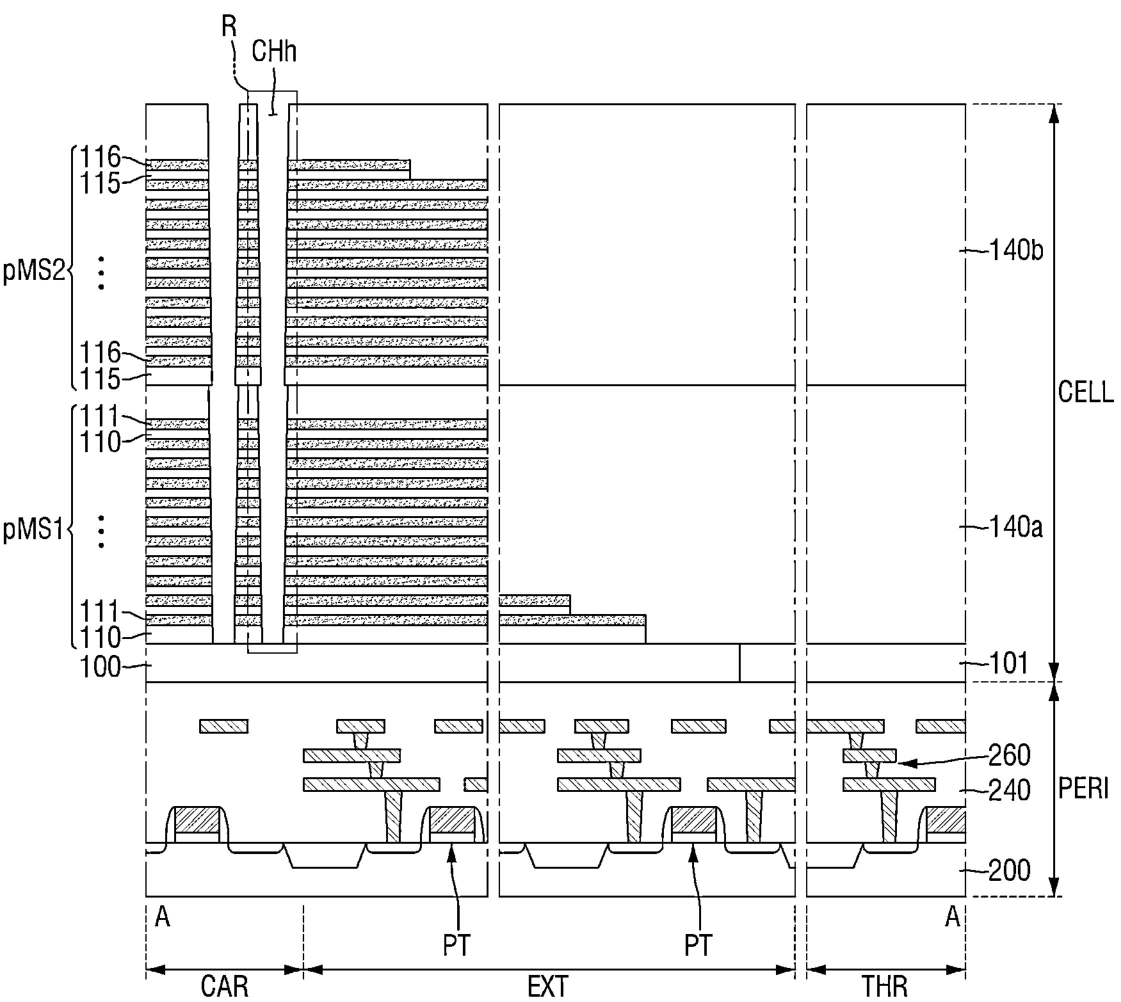
Figure 10:
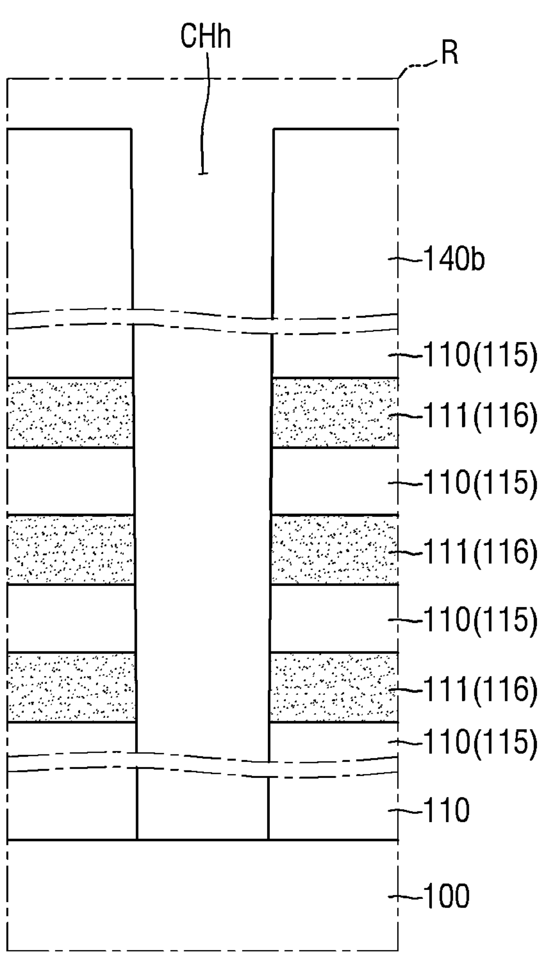

Referring to FIGS. 9 and 10, the first preliminary channel pCH1 and the second preliminary channel pCH2 are removed. For reference, FIG. 10 is an enlarged view for explaining a region R of FIG. 9.

Because the first preliminary channel pCH1 and the second preliminary channel pCH2 may each include a material that has etching selectivity with respect to the first mold insulating films 110 and the first mold sacrificial films 111, they may be selectively removed. As the first preliminary channel pCH1 and the second preliminary channel pCH2 are removed, a channel hole CHh extending in the third direction Z and penetrating the first preliminary mold pMS1 and the second preliminary mold pMS2 may be formed.

Figure 11:
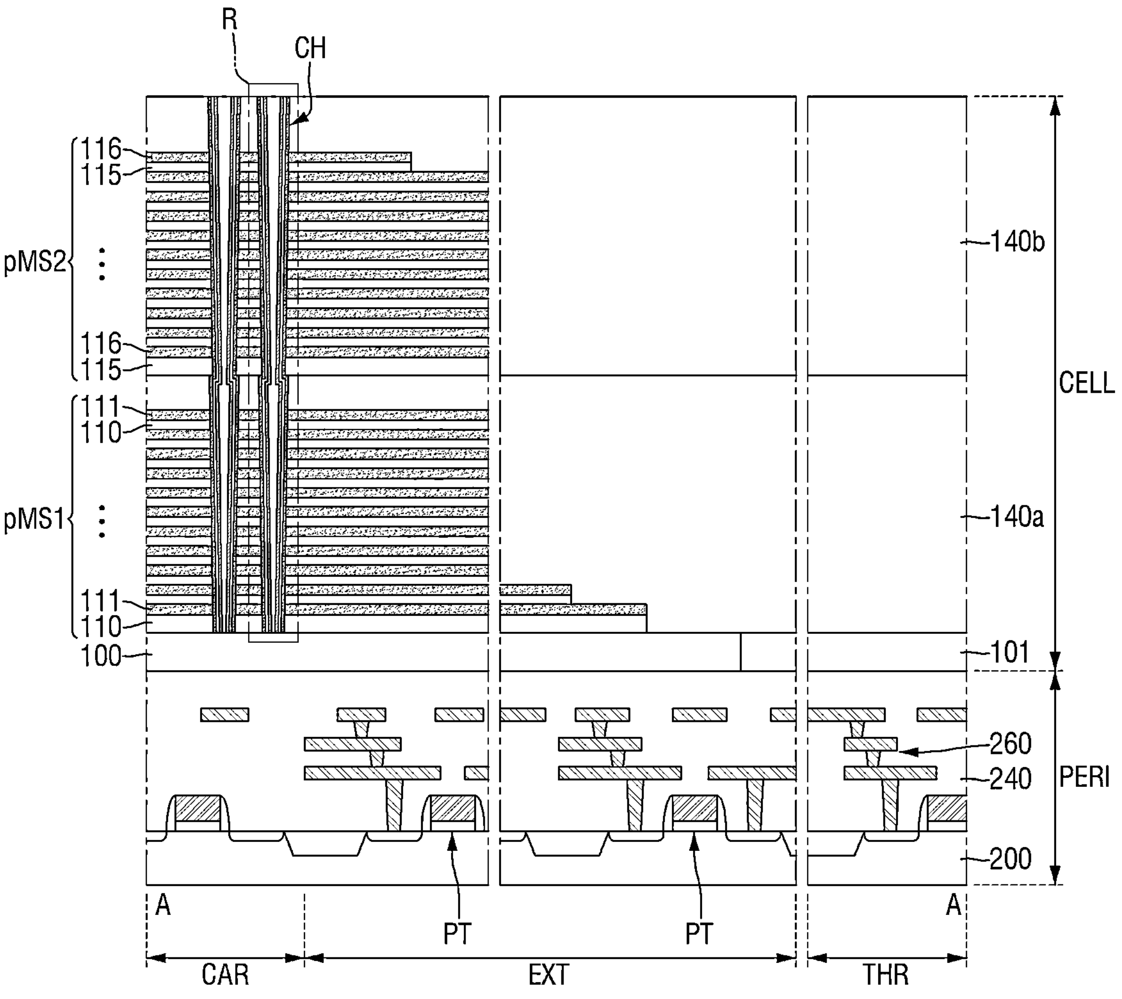
Figure 12A:
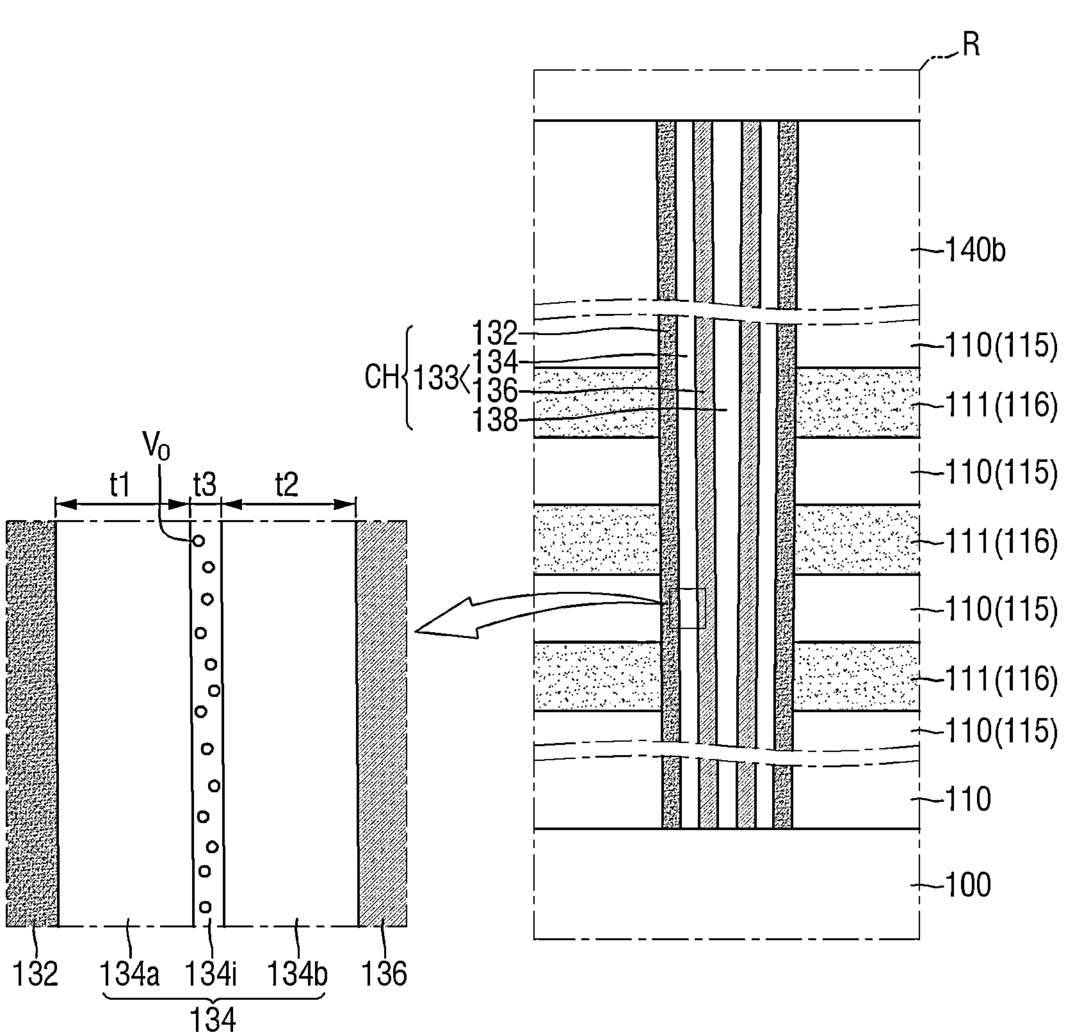
Figure 12B:
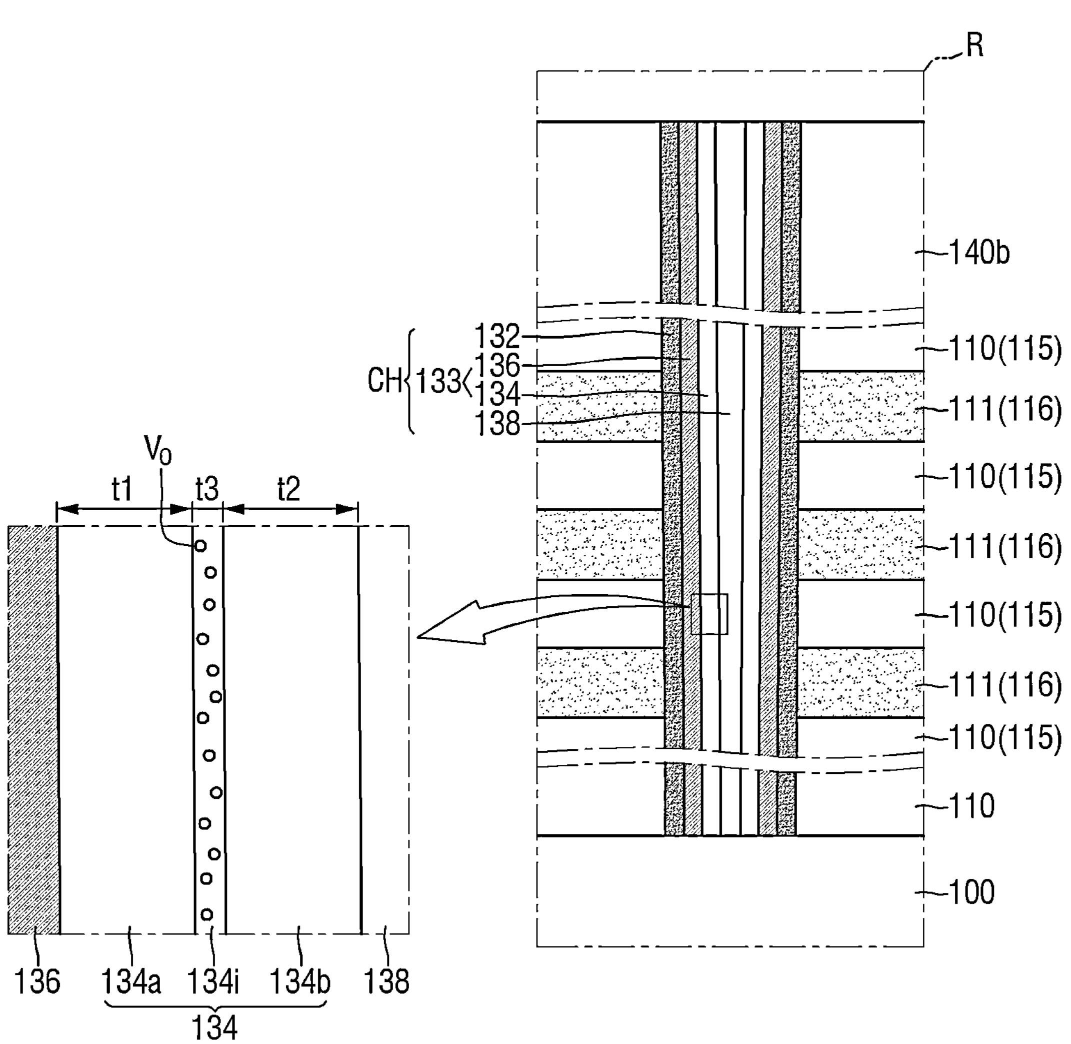
Figure 12C:
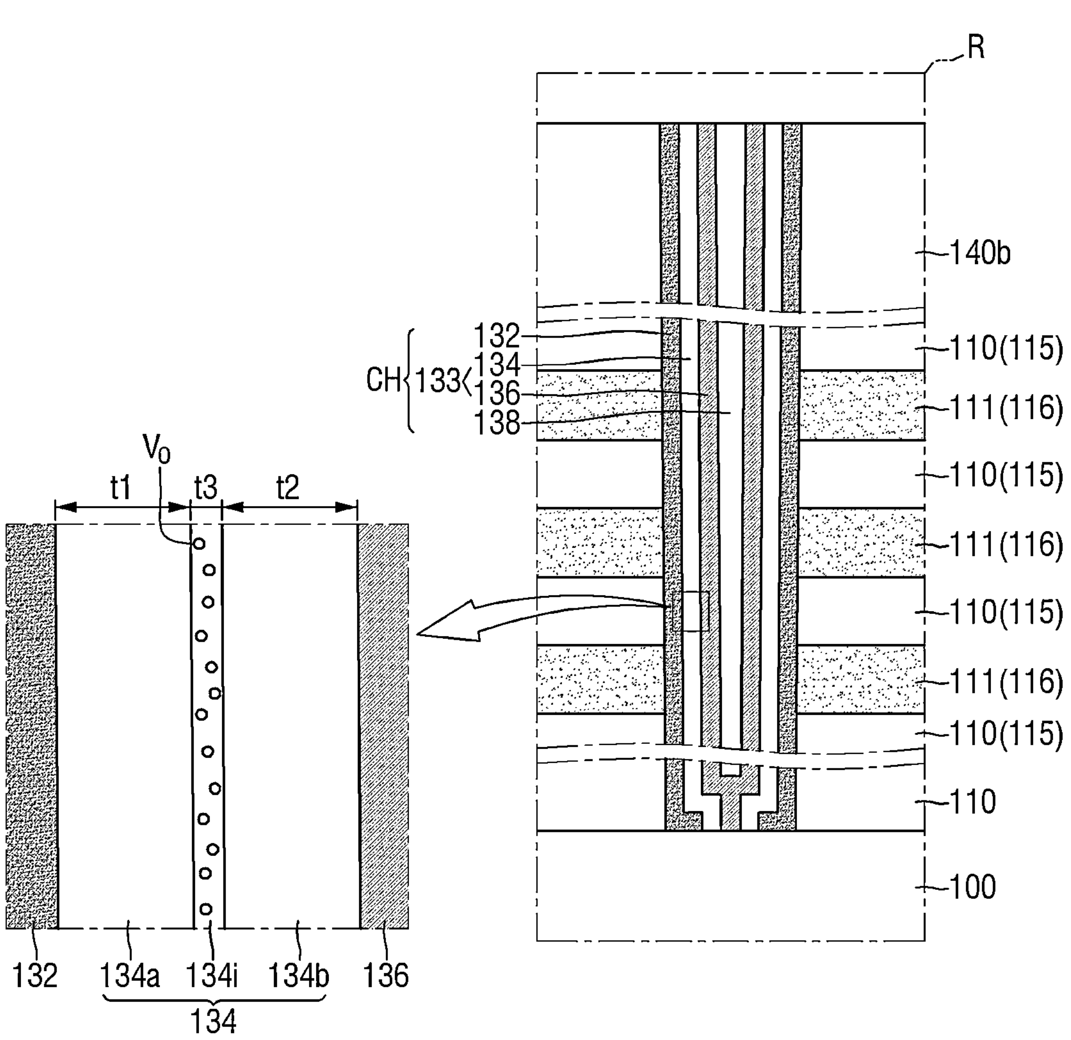

Referring to FIGS. 11 to 12C, a channel structure CH is formed. For reference, FIGS. 12A to 12C are various enlarged views for explaining the region R of FIG. 11.

For example, a gate dielectric layer 132 and a semiconductor layer 133 may be sequentially stacked inside the channel hole CHh of FIGS. 9 and 10. A core insulating layer 138 which fills the region of the channel hole CHh that remains after filling the gate dielectric layer 132 and the semiconductor layer 133 may then be formed.

The semiconductor layer 133 may include an n-type channel layer 134 and a p-type channel layer 136 that extend alongside each other. In some example embodiments, the n-type channel layer 134 and the p-type channel layer 136 may be sequentially stacked on the gate dielectric layer 132, as shown in FIG. 12A.

The n-type channel layer 134 may include an oxide 2-dimensional electron gas (oxide 2-DEG) layer extending in the third direction Z. For example, a first oxide layer 134*a* may be formed on the gate dielectric layer 132 by an atomic layer deposition (ALD) process. A second oxide layer 134*b* may then be formed on the first oxide layer 134*a* by the atomic layer deposition (ALD) process. Accordingly, an interfacial layer 134*i* including oxygen vacancy $V_O$ may be formed between the first oxide layer 134*a* and the second oxide layer 134_b_. Such an interfacial layer 134_i_ may be provided as the oxide two-dimensional electron gas layer of the n-type channel layer 134.

In some example embodiments, the second oxide layer 134_b_ may be formed on the first oxide layer 134_a_ by an atomic layer deposition process that utilizes a reducing precursor. As an example, the first oxide layer 134_a_ may include a $TiO_2$ film, and the second oxide layer 134_b_ may include an $Al_2O_3$ film stacked on the $TiO_2$ film by the atomic layer deposition process which utilizes trimethylaluminum (TMA) as an aluminum precursor.

In some example embodiments, the first oxide layer 134_a_ may further include impurity elements. For example, the first oxide layer 134_a_ may be formed on the gate dielectric layer 132 by the atomic layer deposition (ALD) process that utilizes the impurity elements.

In some example embodiments, the p-type channel layer 136 and the n-type channel layer 134 may be sequentially deposited on the gate dielectric layer 132, as shown in FIG. 12_b_.

In some example embodiments, the lower part of the gate dielectric layer 132 may have an "L" shape, as shown in FIG. 12C. For example, after the gate dielectric layer 132 is formed, a p of the lower part of the gate dielectric layer 132 may be removed to expose a part of the cell substrate 100. Subsequently, a semiconductor layer 133 connected to the cell substrate 100 exposed from the gate dielectric layer 132 may be formed.

Figure 13:
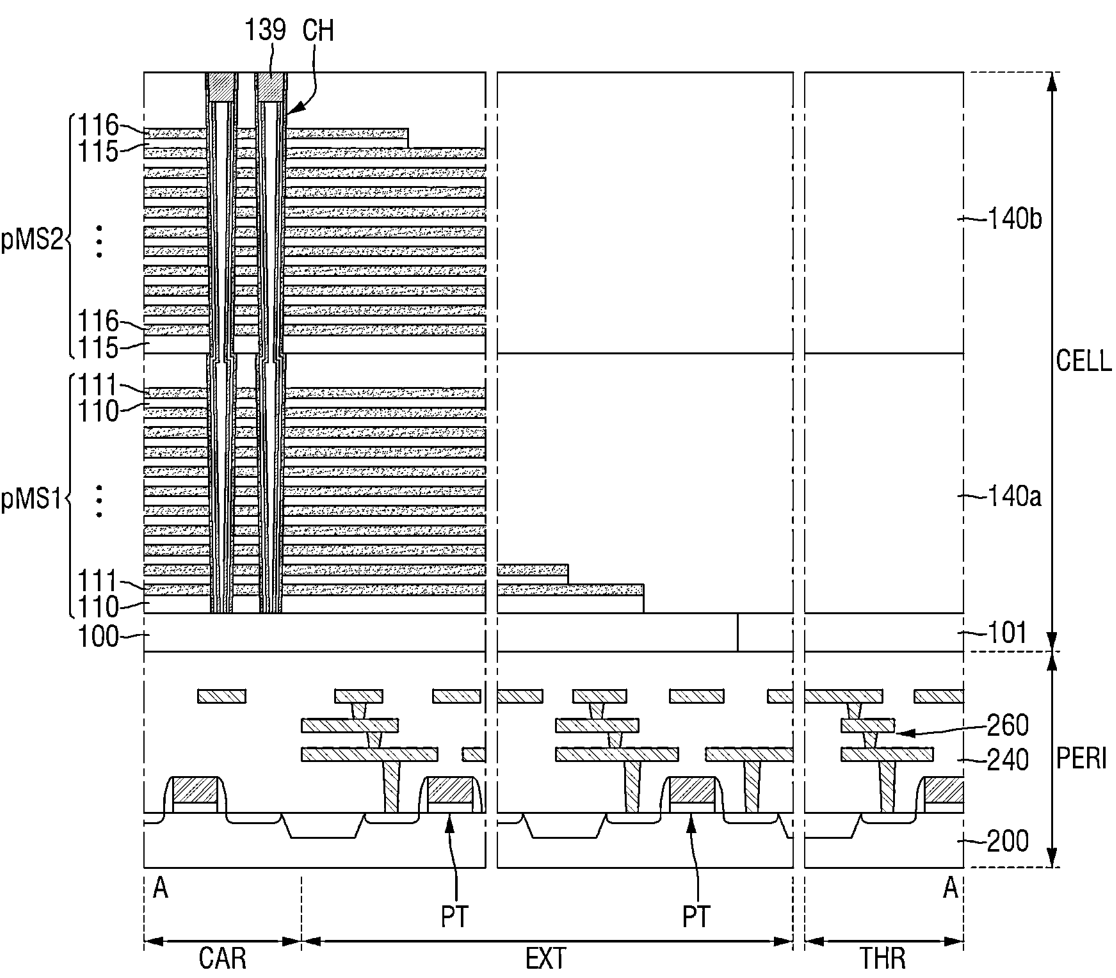
Figure 14:
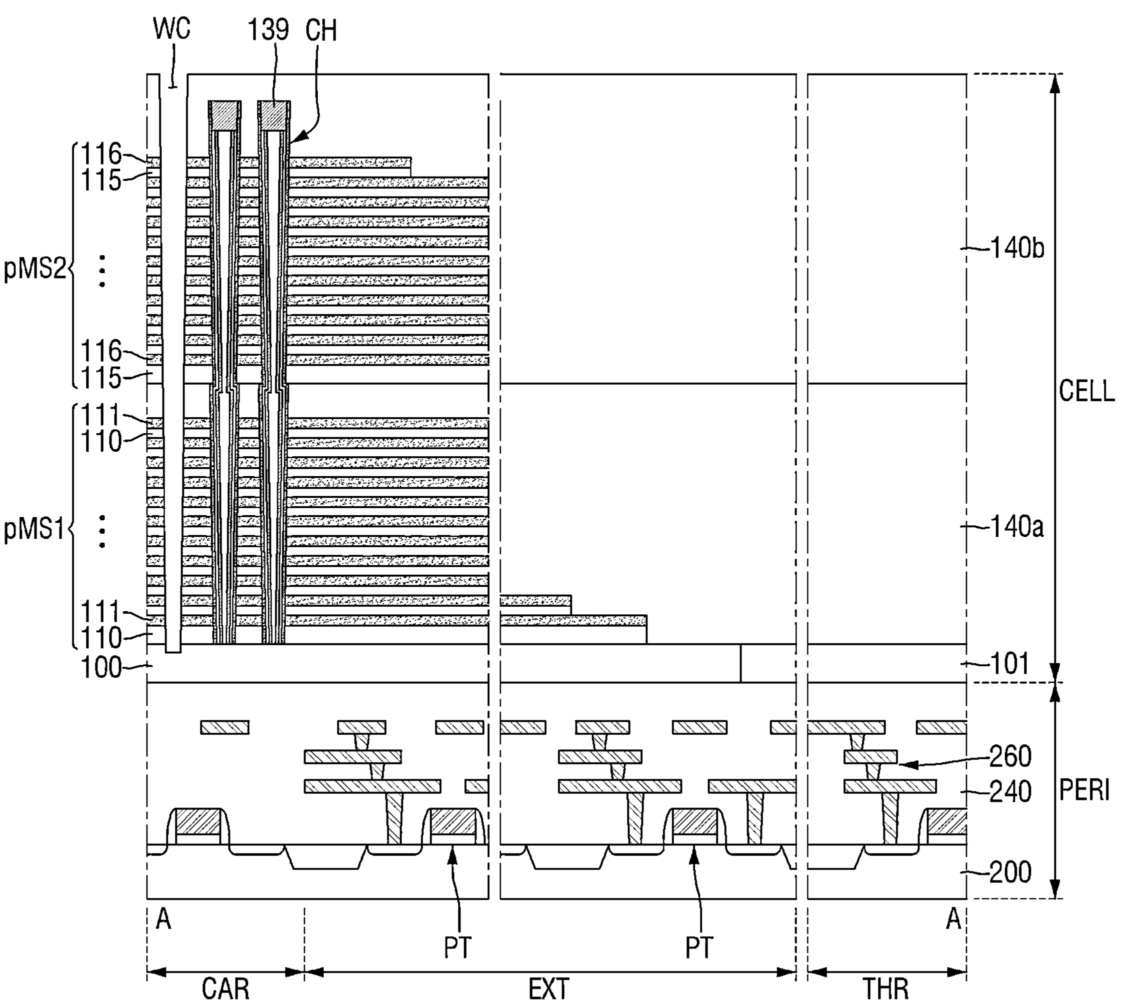

Referring to FIG. 13, a channel pad 139 is formed on the channel structure CH.

The channel pad 139 may be connected to the channel structure CH. For example, the channel pad 139 may be connected to the upper side of the semiconductor layer 133 as explained above using FIG. 5A Referring to FIG. 14, a word line cutting region WC is formed.

The word line cutting region WC may extend in the first direction (e.g., X of FIG. 3) to cut the first preliminary mold pMS1 and the second preliminary mold pMS2.

Figure 15:
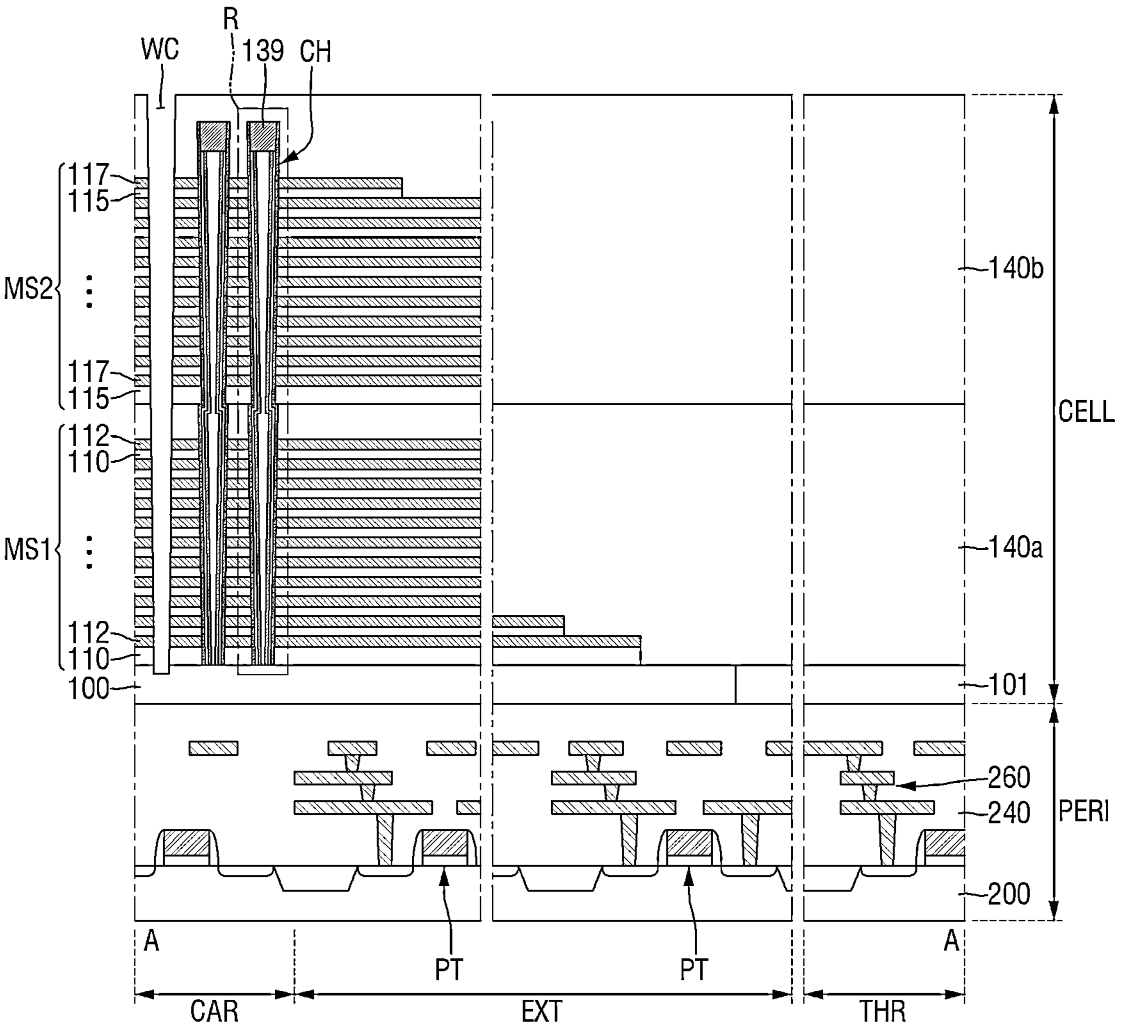
Figure 16:
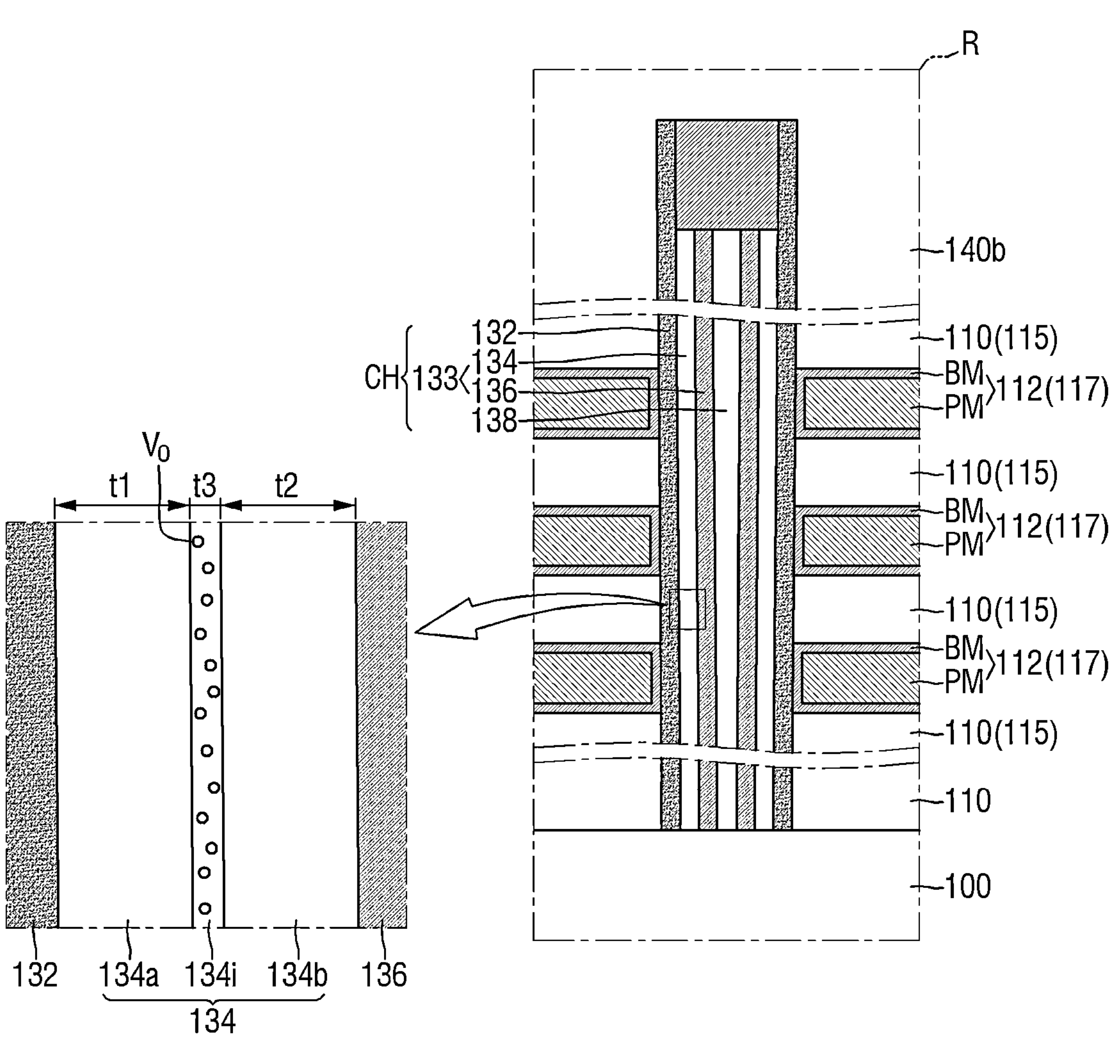

Referring to FIGS. 15 and 16, a plurality of gate electrodes 112 and 117 are formed. For reference, FIG. 16 is an enlarged view for explaining the region R of FIG. 15.

For example, the mold sacrificial films 111 and 116 exposed by the word line cutting region WC may be selectively removed. The gate electrodes 112 and 117 that replace the region from which the mold sacrificial films 111 and 116 are removed may then be formed. Accordingly, a first mold stack MS1 including a plurality of first gate electrodes 112 and a second mold stack MS2 including a plurality of second gate electrodes 117 may be formed.

Figure 17:
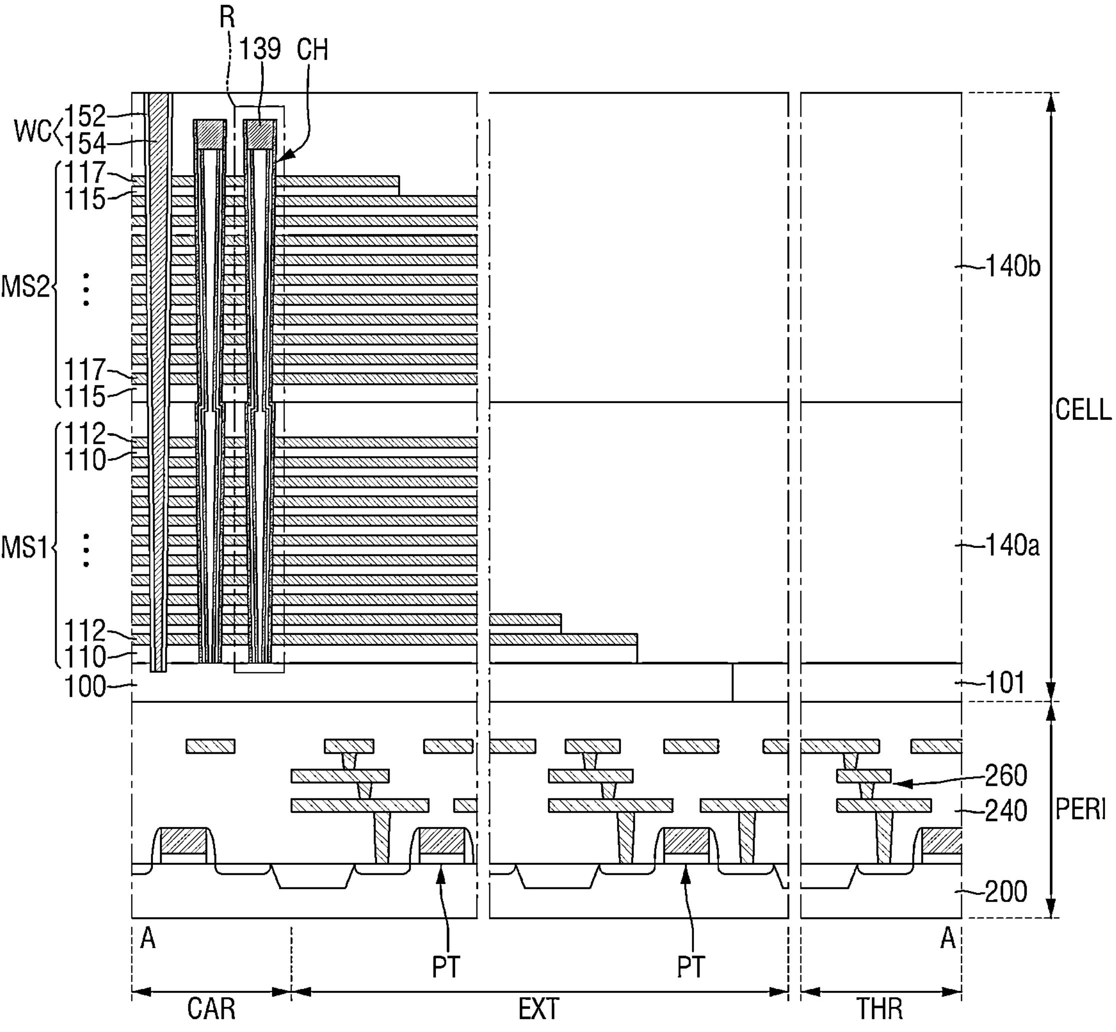

Referring to FIG. 17, an insulating spacer 152 and a first substrate contact 154 are formed.

For example, an insulating film that fills the word line cutting region WC may be formed, and the first substrate contact 154 that penetrates the insulating film and is connected to the cell substrate 100 may be formed. In some other example embodiments, the first substrate contact 154 may be omitted.

Figure 18:
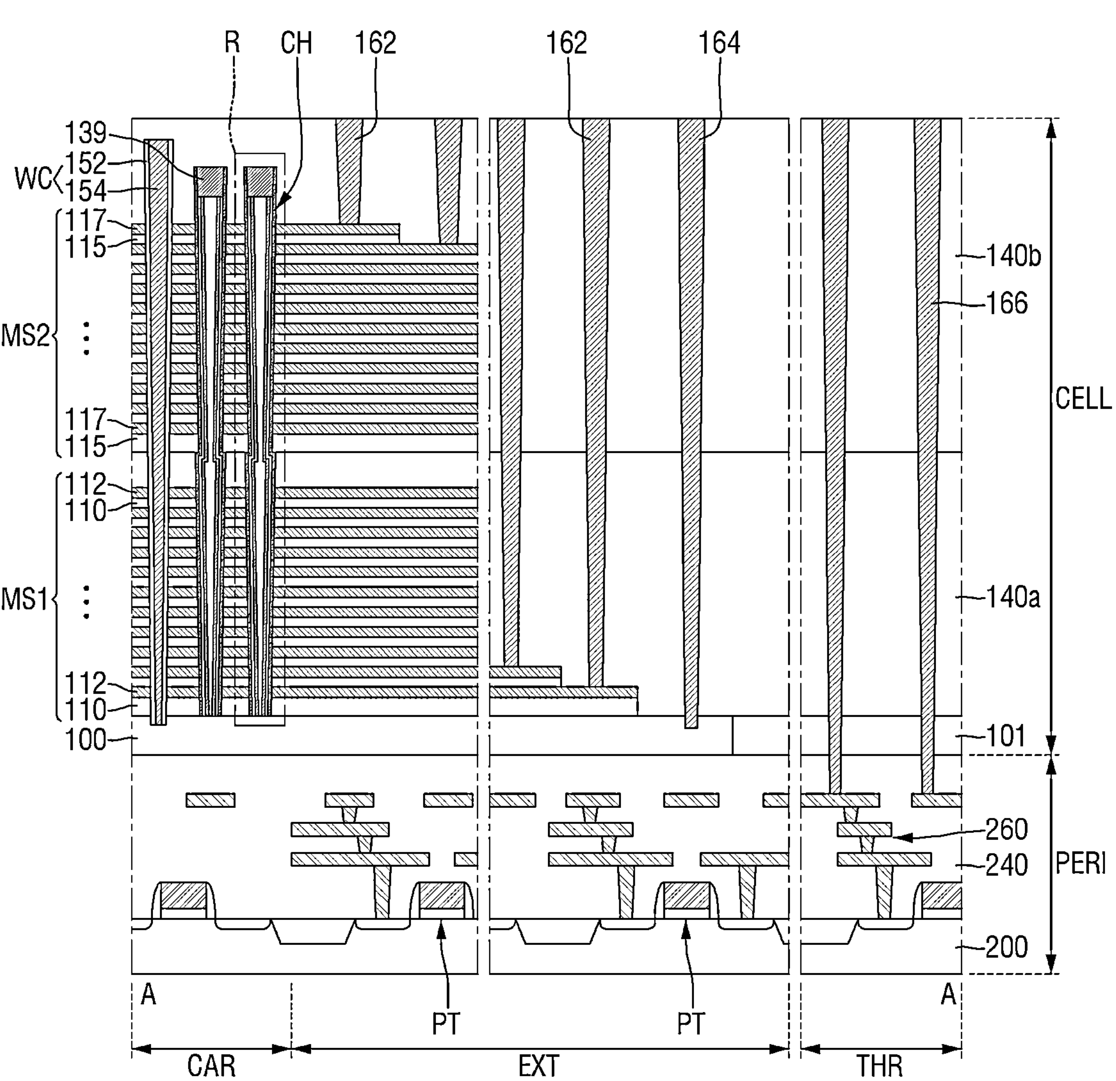

Referring to FIG. 18, a gate contact 162, a second substrate contact 164 and a through plug 166 are formed on the mold structures MS1 and MS2.

A plurality of gate contacts 162 may be connected to a plurality of gate electrodes 112 and 117. The second substrate contact 164 may be connected to the cell substrate 100. The through plug 166 may be connected to the peripheral circuit wiring structure 260.

Next, referring to FIG. 4, a bit line contact 182, a bit line BL, and a cell wiring structure 180 are formed. Accordingly, the semiconductor memory device explained above using FIGS. 3 to 5C may be fabricated.

Figure 19:
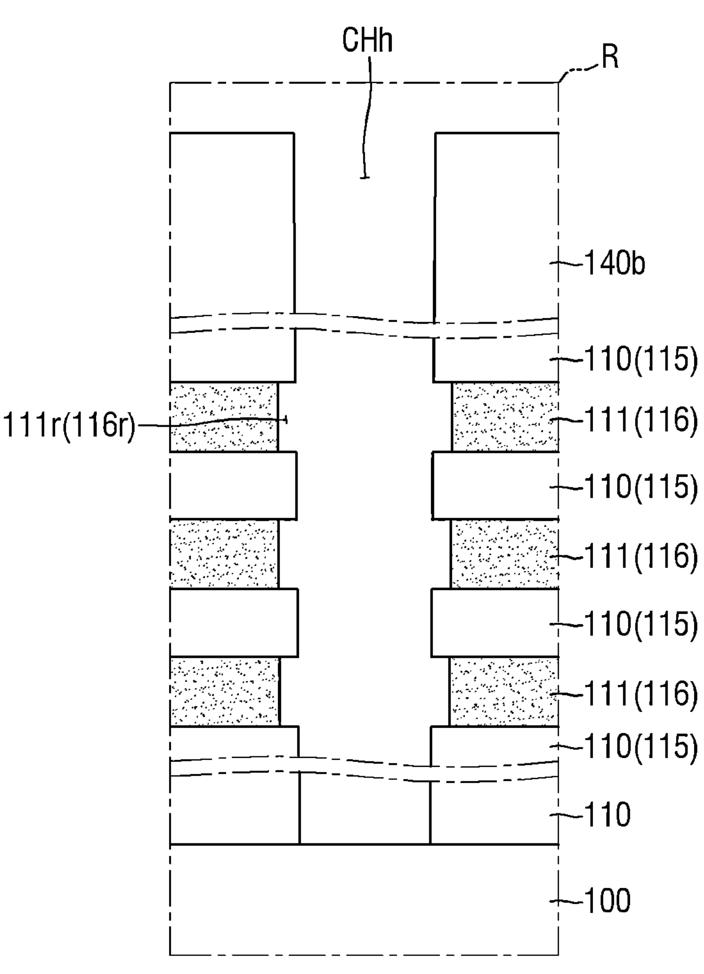
FIGS. 19 and 20 are intermediate step diagrams for explaining a method for fabricating the semiconductor memory device according to an example embodiment.
Figure 20:
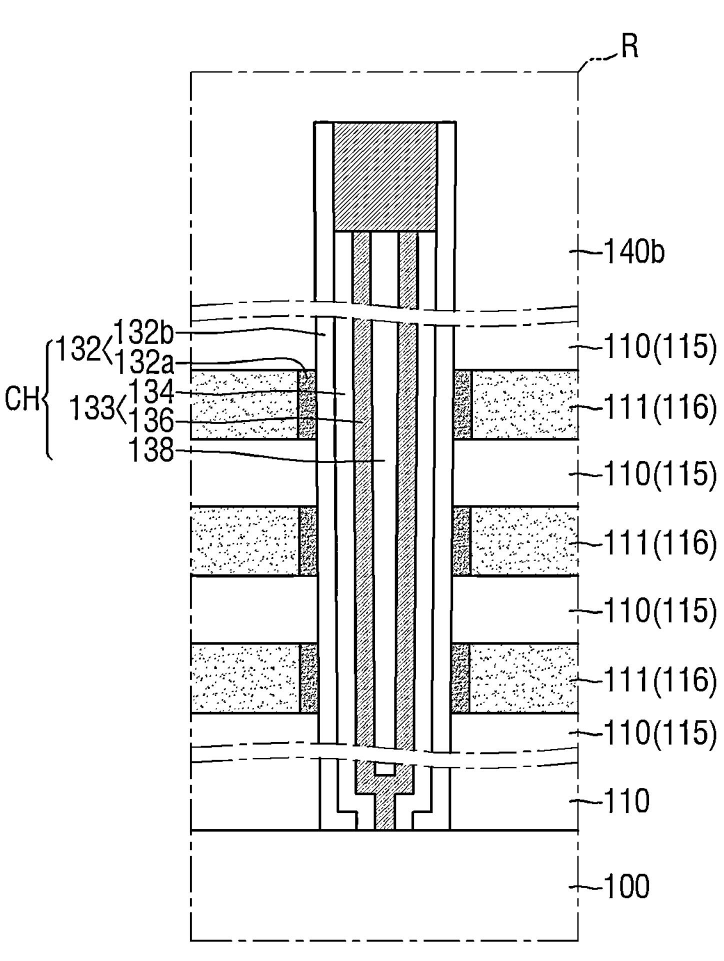

FIGS. 19 and 20 are intermediate step diagrams for explaining a method for fabricating the semiconductor memory device according to an example embodiment. For convenience of explanation, repeated parts of contents explained above using FIGS. 1 to 18 will be briefly explained or omitted. As a reference, FIG. 19 is an intermediate step diagram for explaining the process after FIG. 10.

Referring to FIG. 19, a recess process is performed on the mold sacrificial films 111 and 116. As the recess process is performed, the mold sacrificial films 111 and 116 including first recesses 111_r_ and 116_r_ may be formed.

Referring to FIG. 20, a gate dielectric layer 132 including a ferroelectric layer 132_a_ and an antiferroelectric layer 132_b_ is formed.

The ferroelectric layer 132_a_ may fill the first recesses 111_r_ and 116_r_ of FIG. 19. In some example embodiments, the ferroelectric layers 132_a_ may be separated from each other by the mold insulating films 110 and 115. For example, after forming the ferroelectric layer 132_a_ that fills the first recesses 111_r_ and 116_r_, the ferroelectric layer 132_a_ may be subjected to a recess process. Accordingly, a plurality of ferroelectric layers 132_a_ corresponding to the plurality of gate electrodes 112 and 117 may be formed. The antiferroelectric layer 132_b_ may be stacked on the ferroelectric layer 132_a_. In some example embodiments, the antiferroelectric layer 132_b_ may extend continuously in the third direction Z.

Subsequently, a semiconductor layer 133 and a core insulating layer 138 may be formed on the gate dielectric layer 132. Because the formation of the semiconductor layer 133 and the core insulating layer 138 is similar to that explained above using FIGS. 11 and 12, a detailed explanation thereof will not be provided.

The steps explained above using FIGS. 13 to 18 and 4 may then be performed. Thus, the semiconductor memory device explained above using FIGS. 4 and 5D may be fabricated.

Figure 21:
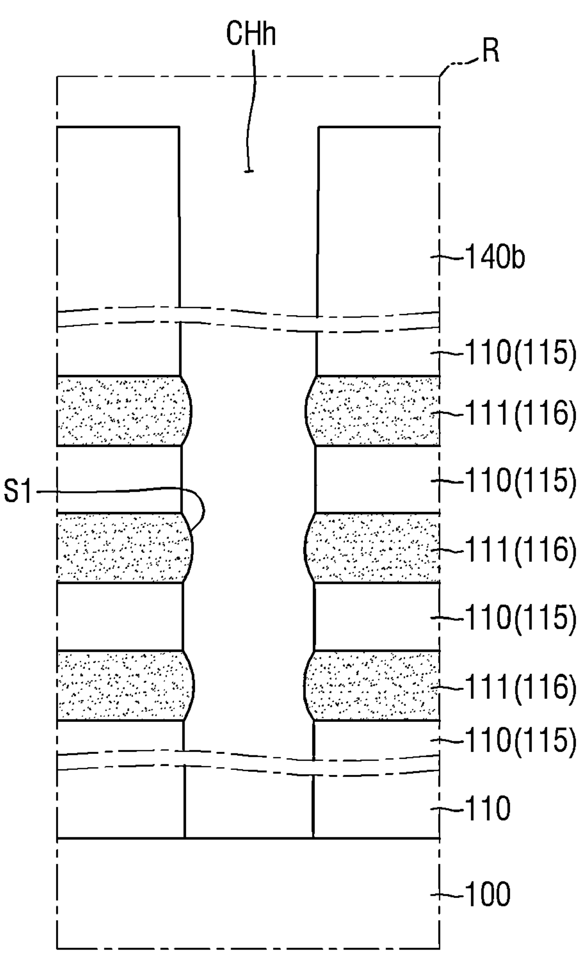
FIG. 21 is an intermediate step diagram for explaining a method for fabricating a semiconductor memory device according to an example embodiment.

FIG. 21 is an intermediate step diagram for explaining a method for fabricating a semiconductor memory device according to an example embodiment. For convenience of explanation, repeated parts of contents explained above using FIGS. 1 to 18 will be briefly explained or omitted. For reference, FIG. 21 is an intermediate step diagram for explaining the process after FIG. 10.

Referring to FIG. 21, a recess process is performed on the mold insulating films 110 and 115. As the recess process is performed, the mold sacrificial films 111 and 116 may protrude beyond the mold insulating films 110 and 115 toward the channel hole CHh.

For example, the mold sacrificial films 111 and 116 may include first side surfaces S1 that protrude beyond the mold insulating films 110 and 115. In some embodiments, the first side surface S1 may include a convex face that is convex toward the channel hole CHh.

The steps explained above using FIGS. 11 to 18 and 4 may then be performed. Thus, the semiconductor memory device explained above using FIGS. 4 and 5E may be fabricated.

Figure 22:
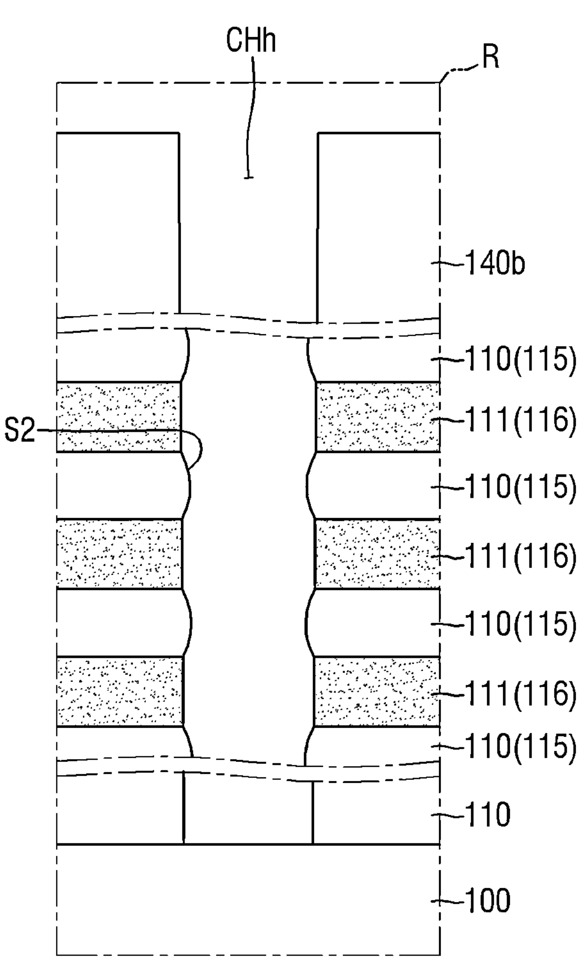
FIGS. 22 to 25 are intermediate step diagrams for explaining a method for fabricating a semiconductor memory device according to an example embodiment.

FIGS. 22 to 25 are intermediate step diagrams for explaining a method for fabricating a semiconductor memory device according to an example embodiment. For convenience of explanation, repeated parts of contents explained above using FIGS. 1 to 18 will be briefly explained or omitted. For reference, FIG. 22 is an intermediate step diagram for explaining a process after FIG. 10.

Referring to FIG. 22, a recess process is performed on the mold sacrificial films 111 and 116. As the recess process is performed, the mold insulating films 110 and 115 may protrude beyond the mold sacrificial films 111 and 116 toward the channel hole CHh.

For example, the mold insulating films 110 and 115 may include a second side surface S2 that protrudes beyond the mold sacrificial films 111 and 116. In some example embodiments, the second side surface S2 may include a convex face that is convex toward the channel hole CHh.

Figure 23:
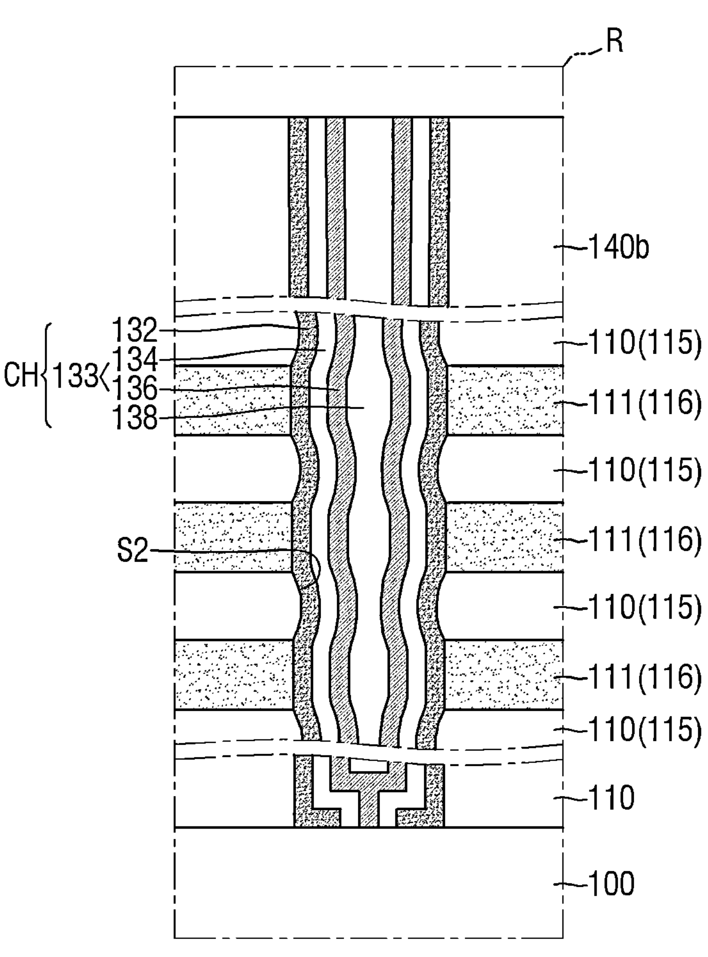

Referring to FIG. 23, a channel structure CH is formed. Because the formation of the channel structure CH is similar to that explained above using FIGS. 11 to 12C, a detailed explanation thereof will not be provided below.

Figure 24:
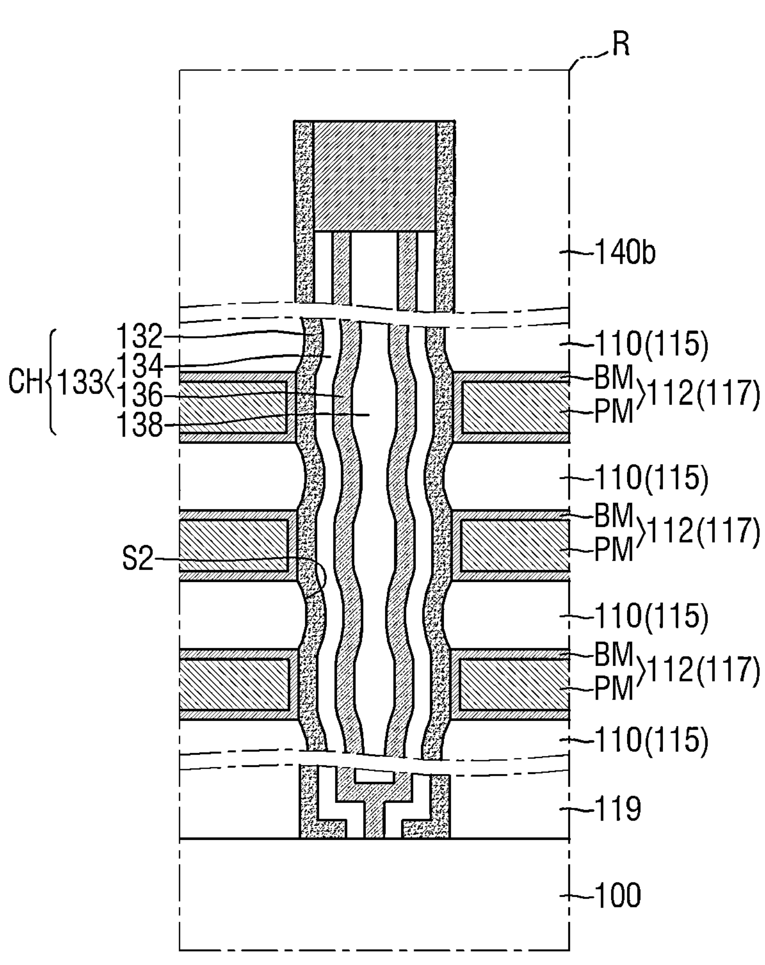

Referring to FIG. 24, gate electrodes 112 and 117 are formed. Because the formation of the gate electrodes 112 and 117 is similar to that explained above using FIGS. 13 to 16, a detailed explanation thereof will not be provided below.

Figure 25:
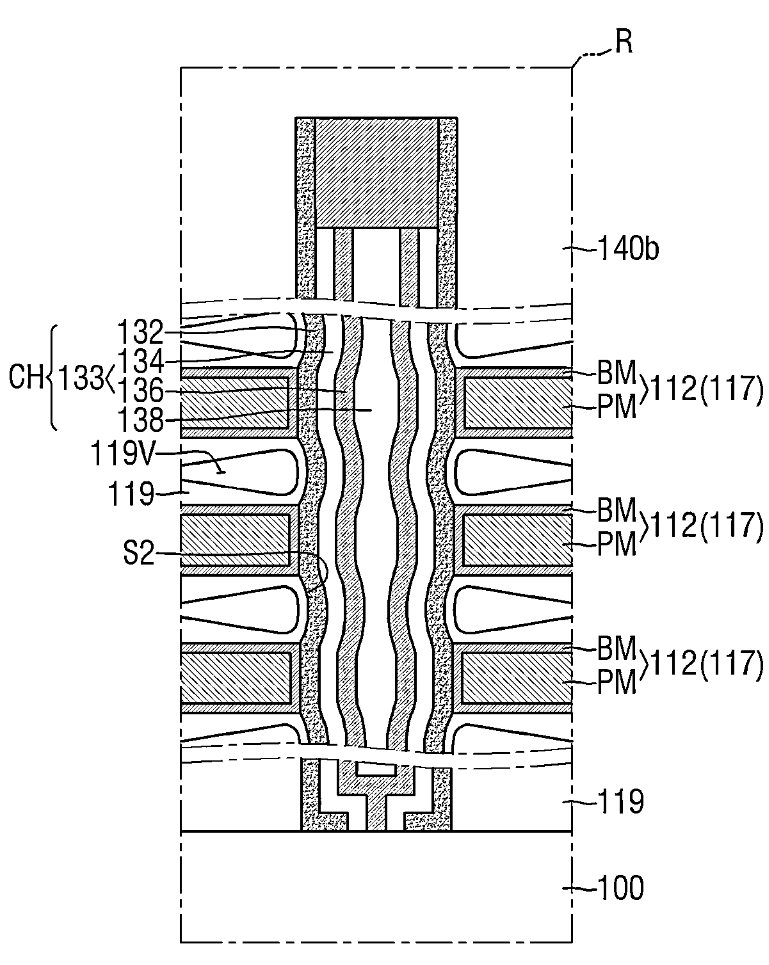

Referring to FIG. 25, a void 119V is formed.

The void 119V may be interposed between the gate electrodes 112 and 117 to be stacked. For example, the mold insulating films 110 and 115 may be removed, and the sealing insulating film 119 with poor step coverage may be deposited in the region from which the mold insulating films 110 and 115 are removed. Accordingly, the sealing insulating film 119 including the void 119V may be formed inside.

The steps explained above using FIGS. 17, 18 and 4 may then be performed. Thus, the semiconductor memory device explained above using FIGS. 4 and 5F may be fabricated.

Figure 26:
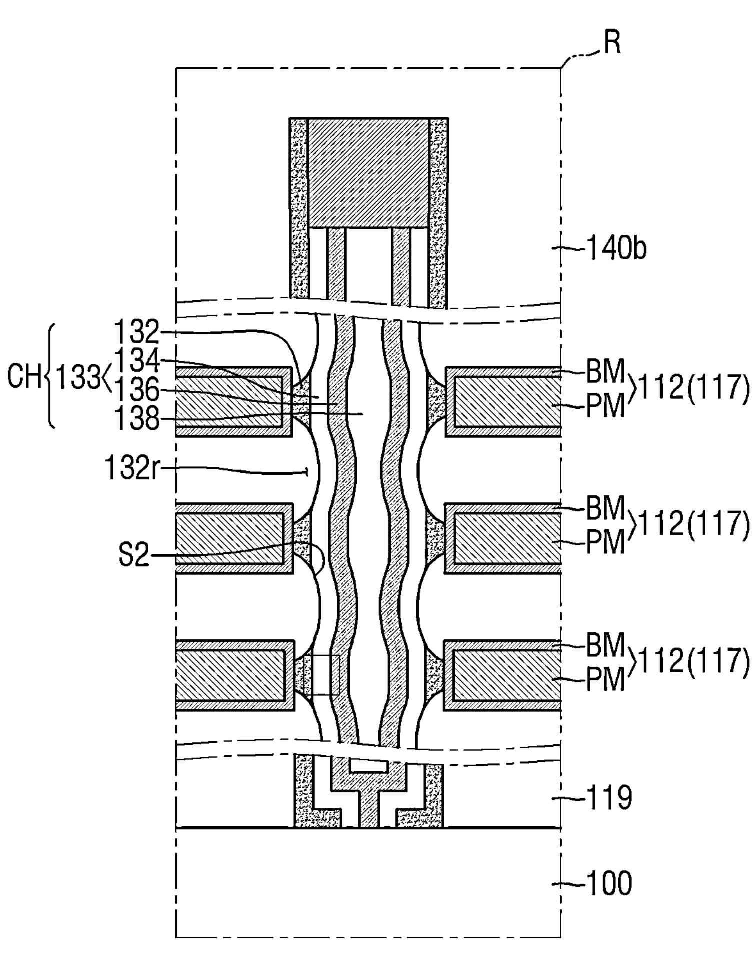
FIG. 26 is an intermediate step diagram for explaining a method for fabricating a semiconductor memory device according to an example embodiment.

FIG. 26 is an intermediate step diagram for explaining a method for fabricating a semiconductor memory device according to an example embodiment. For convenience of explanation, repeated parts of contents explained above using FIGS. 1 to 25 will be briefly explained or omitted. For reference, FIG. 26 is an intermediate step diagram for explaining a step after FIG. 24.

Referring to FIG. 26, a second recess 132*r* that cuts the gate dielectric layer 132 is formed.

For example, the mold insulating films 110 and 115 may be removed, and a part of the gate dielectric layer 132 exposed with the removal of the mold insulating films 110 and 115 may be removed. Accordingly, a plurality of ferroelectric layers 132*a* corresponding to the plurality of gate electrodes 112 and 117, respectively, may be formed.

The steps explained above using FIGS. 25, 17, 18 and 4 may then be performed. Thus, the semiconductor memory device explained above using FIGS. 4 and 5G may be fabricated.

An electronic system including the semiconductor memory device according to example embodiments will be described below with reference to FIGS. 1 to 29.

Figure 27:
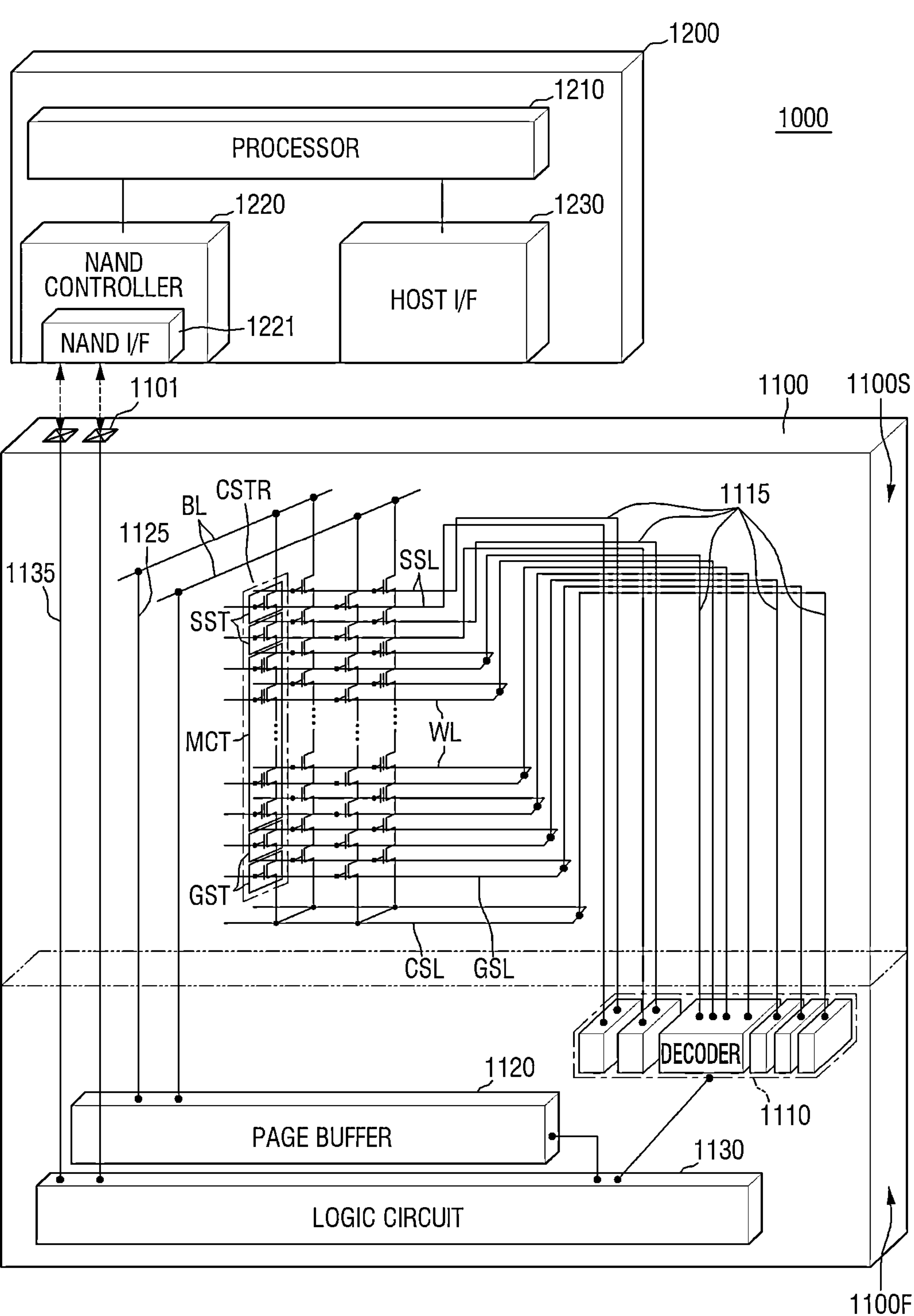
FIG. 27 is an example block diagram for explaining an electronic system according to an example embodiment.
Figure 28:
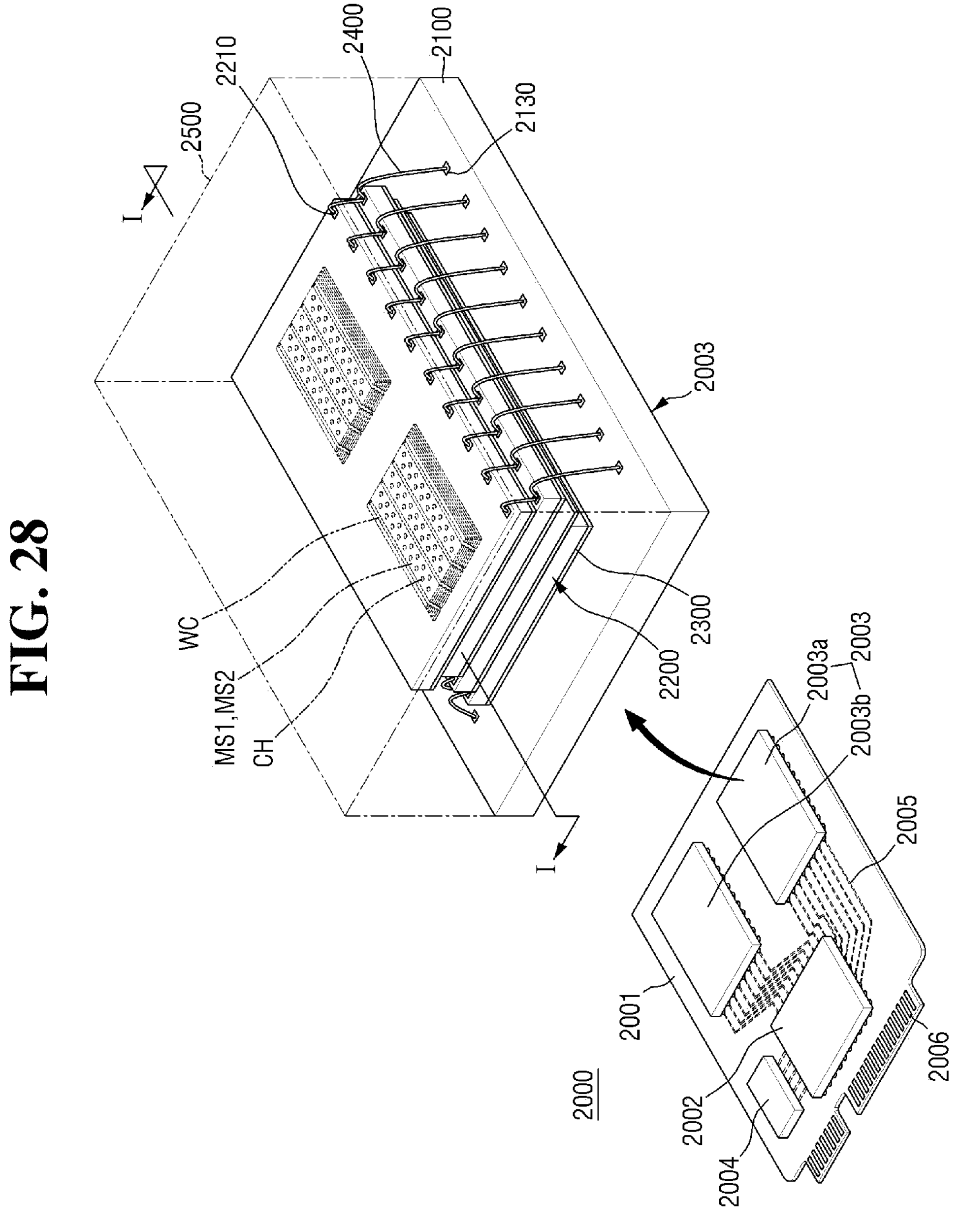
FIG. 28 is an example perspective view for explaining an electronic system according to an example embodiment.
Figure 29:
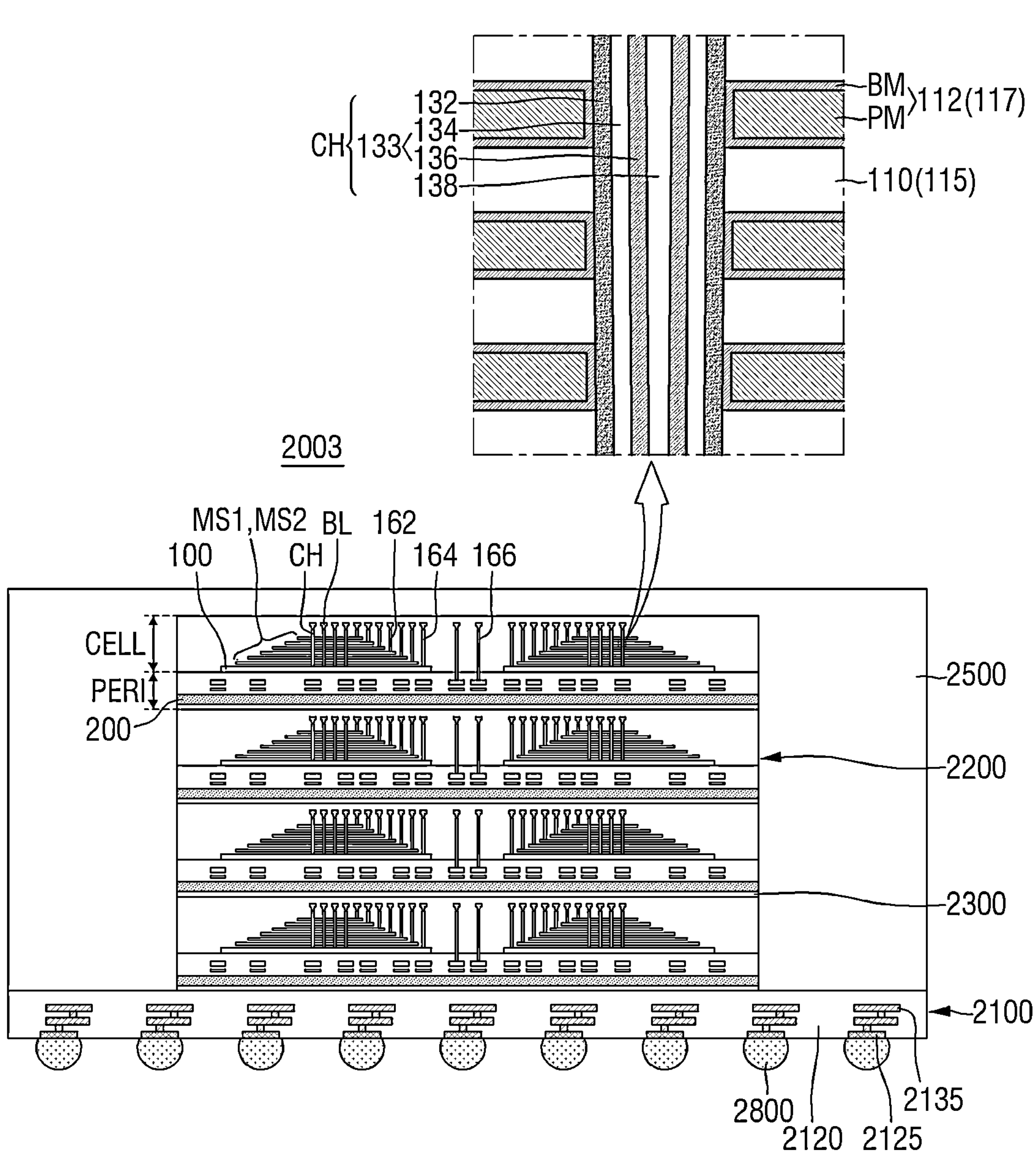
FIG. 29 is a schematic cross-sectional view taken along I-I of FIG. 28.

FIG. 27 is an example block diagram for explaining an electronic system according to an example embodiment. FIG. 28 is an example perspective view for explaining an electronic system according to an example embodiment. FIG. 29 is a schematic cross-sectional view taken along I-I of FIG. 28.

Referring to FIG. 27, an electronic system 1000 according to an example embodiment may include a semiconductor memory device 1100, and a controller 1200 that is electrically connected to the semiconductor memory device 1100. The electronic system 1000 may be a storage device that includes one or multiple semiconductor memory devices 1100, or an electronic device that includes the storage device. For example, the electronic system 1000 may be an SSD device (solid state drive device), a USB (Universal Serial Bus), a computing system, a medical device or a communication device that includes one or multiple semiconductor memory devices 1100.

The semiconductor memory device 1100 may be a non-volatile memory device (e.g., a NAND flash memory device), and may be, for example, the semiconductor memory device explained above using FIGS. 1 to 6. The semiconductor memory device 1100 may include a first structure 1100F, and a second structure 1100S on the first structure 1100F.

The first structure 1100F may be a peripheral circuit structure including a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1). The first structure 1100F may correspond to, for example, the peripheral circuit structure PERI explained above using FIGS. 1 to 6.

The second structure 1100S may include the common source line CSL, a plurality of bit lines BL, and a plurality of cell strings CSTR explained above using FIG. 2. The cell strings CSTR may be connected to the decoder circuit 1110 through the word line WL, at least one string selection line SSL, and at least one ground selection line GSL. In addition, the cell strings CSTR may be connected to the page buffer 1120 through the bit lines BL. The second structure 1100S may correspond to, for example, the cell structure CELL explained above using FIGS. 1 to 6.

In some example embodiments, the common source line CSL and cell strings CSTR may be electrically connected to the decoder circuit 1110 through first connection wirings 1115 extending from the first structure 1100F to the second structure 1100S. The first connection wiring 1115 may correspond to, for example, a part of the through plug 166 explained above using FIGS. 1 to 6.

In some example embodiments, the bit lines BL may be electrically connected to the page buffer 1120 through the second connection wiring 1125. The second connection wiring 1125 may correspond to, for example, another part of the through plug 166 explained above using FIGS. 1 to 6.

The semiconductor memory device 1100 may communicate with the controller 1200 through an I/O pad 1101 electrically connected to the logic circuit 1130 (e.g., the control logic 37 of FIG. 1). The I/O pad 1101 may be electrically connected to the logic circuit 1130 through the I/O connection wiring 1135 extending from the inside of the first structure 1100F to the second structure 1100S.

The controller 1200 may include a processor 1210, a NAND controller 1220, and a host interface 1230. In some example embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a desired (or alternatively, predetermined) firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Referring to FIGS. 28 and 29, the electronic system according to an example embodiment may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of fins coupled to an external host. In the connector 2006, the number and disposition of the plurality of fins may vary depending on the communication interface between the electronic system 2000 and the external host. In some example embodiments, the electronic system 2000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage). In some example embodiments, the electronic system 2000 may operate by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b* that are spaced apart from each other. The first semiconductor package 2003*a* and the second semiconductor package 2003*b* may each be a semiconductor package that includes a plurality of semiconductor chips 2200. The first semiconductor package 2003*a* and the second semiconductor package 2003*b* may each include a package substrate 2100, semiconductor chips 2200 on the package substrate 2100, adhesive layers 2300 disposed on the lower sides of each of the package chips 220, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 28.

In some example embodiments, the connecting structure 2400 may be a bonding wire that electrically connects the I/O pad 2101 and the package upper pads 2130. Therefore, in each of the first semiconductor package 2003*a* and the second semiconductor package 2003*b*, the semiconductor chips 2200 may be electrically connected to each other by a bonding wire type, and may be electrically connected to the package upper pads 2130 of the package substrate 2100. In some example embodiments, in each of the first semiconductor package 2003*a* and the second semiconductor package 2003*b*, the semiconductor chips 2200 may be electrically connected to each other by a connecting structure including a through electrode (Through Silicon Via, TSV) instead of the connecting structure 2400 of the bonding wire type.

In some example embodiments, the main controller 2002 and the semiconductor chips 2200 may also be included in a single package. In some example embodiments, the main controller 2002 and the semiconductor chips 2200 are mounted on a separate interposer substrate different from the main board 2001, and the main controller 2002 and the semiconductor chips 2200 may also be connected to each other by the wiring formed on the interposer substrate.

In some example embodiments, the package substrate 2100 may be a printed circuit board. The package substrate 2100 may include a package substrate body portion 2120, package upper pads 2130 disposed on an upper side of the package substrate body portion 2120, lower pads 2125 disposed on a lower side of the package substrate body portion 2120 or exposed through the lower side, and inner wirings 2135 that electrically connect the upper pads 2130 and the lower pads 2125 inside the package substrate body portion 2120. The upper pads 2130 may be electrically connected to the connecting structures 2400. The lower pads 2125 may be connected to the wiring patterns 2005 of the main board 2001 of the electronic system 2000 through conductive connections 2800 as in FIG. 29.

In the electronic system according to some example embodiments, each of the semiconductor chips 2200 may include the semiconductor memory device described above using FIGS. 1 to 6. For example, each of the semiconductor chips 2200 may include a peripheral circuit structure PERI, and a cell structure CELL stacked on the peripheral circuit structure PERI. As an example, the peripheral circuit structure PERI may include the peripheral circuit board 200 and the peripheral circuit wiring structure 260 explained above using FIGS. 3 and 4. Further, as an example, the cell structure CELL may include the cell substrate 100, the mold structures MS1 and MS2, the channel structure CH, the bit line BL, the gate contact 162, the second substrate contact 164, and the through plug 166 explained above using FIGS. 3 and 4. The channel structure CH may also include the gate dielectric layer 132, the semiconductor layer 133, and the core insulating layer 138 explained above using FIGS. 5A to 5G.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor memory device comprising:

a cell substrate;

a plurality of gate electrodes sequentially stacked on the cell substrate;

a semiconductor layer extending in a vertical direction, intersecting an upper side of the cell substrate, and intersecting the plurality of gate electrodes; and a gate dielectric layer including ferroelectrics between each of the plurality of gate electrodes and the semiconductor layer, wherein the semiconductor layer includes an n-type channel layer and a p-type channel layer each extending in the vertical direction, and the n-type channel layer includes an oxide 2-dimensional electron gas (2-DEG) layer extending in the vertical direction.

2. The semiconductor memory device of claim 1, wherein the n-type channel layer comprises a first oxide layer and a second oxide layer sequentially stacked on the gate dielectric layer, and an interfacial layer including an oxygen vacancy and between the first oxide layer and the second oxide layer, and the oxide 2-DEG layer is a layer induced by the oxygen vacancy.

3. The semiconductor memory device of claim 2, wherein the first oxide layer comprises at least one of $TiO_2$, $SrTiO_3$, $In_2O_3$, $WO_3$, ZnO, and combinations thereof.

4. The semiconductor memory device of claim 2, wherein the second oxide layer comprises $Al_2O_3$.

5. The semiconductor memory device of claim 1, wherein the p-type channel layer comprises at least one of $Si_2Te_3$, Te, $\beta TeO_2$, $WSe_2$, NiO, $Cu_2O$, CuO, SnO, $CuAlO_2$, $CuCrO_2$, and combinations thereof.

6. The semiconductor memory device of claim 1, wherein the n-type channel layer is interposed between the gate dielectric layer and the p-type channel layer.

7. The semiconductor memory device of claim 1, wherein the p-type channel layer is interposed between the gate dielectric layer and the n-type channel layer.

8. The semiconductor memory device of claim 1, wherein the gate dielectric layer comprises a ferroelectric layer and an antiferroelectric layer which are sequentially stacked on side surfaces of each of the plurality of gate electrodes.

9. The semiconductor memory device of claim 8, wherein the gate dielectric layer comprises a plurality of ferroelectric layers corresponding to the plurality of gate electrodes, and the antiferroelectric layer extends in the vertical direction and intersects the plurality of gate electrodes.

10. The semiconductor memory device of claim 1, further comprising:

a bit line on the plurality of gate electrodes, wherein each of the n-type channel layer and the p-type channel layer electrically connect the cell substrate and the bit line.

11. A semiconductor memory device comprising:

a cell substrate;

a mold structure including a plurality of gate electrodes sequentially stacked on the cell substrate;

a channel structure extending in a vertical direction, intersecting an upper side of the cell substrate, and penetrating the mold structure; and a bit line on the mold structure, wherein the channel structure includes a ferroelectric layer, an n-type channel layer, a p-type channel layer, and a core insulating layer that are sequentially stacked on side surfaces of each of the plurality of gate electrodes, each of the n-type channel layer and the p-type channel layer electrically connect the cell substrate and the bit line, and the n-type channel layer includes a first oxide layer, and a second oxide layer, and an interfacial layer, the first oxide layer and the second oxide layer being sequentially stacked on the ferroelectric layer, the interfacial layer including an oxygen vacancy and between the first oxide layer and the second oxide layer.

12. The semiconductor memory device of claim 11, wherein the interfacial layer comprises an oxide 2-dimensional electron gas (oxide 2-DEG) layer due to the oxygen vacancy.

13. The semiconductor memory device of claim 11, wherein the first oxide layer comprises at least one of $TiO_2$, $SrTiO_3$, $In_2O_3$, $WO_3$, ZnO, and combinations thereof, and the second oxide layer comprises $Al_2O_3$.

14. The semiconductor memory device of claim 13, wherein the second oxide layer is between the first oxide layer and the p-type channel layer.

15. The semiconductor memory device of claim 11, further comprising:

a word line cutting region extending in a first direction and cuts the mold structure, wherein the bit line extends in a second direction intersecting the first direction.

16. The semiconductor memory device of claim 11, wherein the core insulating layer has a pillar shape extending in the vertical direction and intersecting the upper side of the cell substrate, the p-type channel layer surrounds a side surface of the core insulating layer, the n-type channel layer surrounds a side surface of the p-type channel layer, and the ferroelectric layer surrounds a side surface of the n-type channel layer.

17. The semiconductor memory device of claim 11, further comprising:

a peripheral circuit board;

a peripheral circuit element on the peripheral circuit board; and a peripheral circuit wiring structure electrically connected to the peripheral circuit element, on the peripheral circuit board, wherein the cell substrate is stacked on the peripheral circuit wiring structure.

18. An electronic system comprising:

a main board;

a semiconductor memory device on the main board; and a controller electrically connected to the semiconductor memory device, on the main board, wherein the semiconductor memory device includes, a cell substrate, a plurality of gate electrodes sequentially stacked on the cell substrate, a semiconductor layer extending in a vertical direction, intersecting an upper side of the cell substrate, intersecting the plurality of gate electrodes, and a gate dielectric layer including ferroelectrics, between each of the gate electrodes and the semiconductor layer, wherein the semiconductor layer includes an n-type channel layer and a p-type channel layer each extending in the vertical direction, and the n-type channel layer includes an oxide 2-dimensional electron gas (oxide 2-DEG) layer extending in the vertical direction.

19. The electronic system of claim 18, wherein the n-type channel layer comprises a first oxide layer, a second oxide layer, and an interfacial layer, the first oxide layer and the second oxide layer sequentially stacked on the gate dielectric layer, the interfacial layer including an oxygen vacancy and between the first oxide layer and the second oxide layer, and the oxide 2-DEG layer is a layer induced by the oxygen vacancy.

20. The electronic system of claim 19, wherein the first oxide layer comprises at least one of $TiO_2$, $SrTiO_3$, $In_2O_3$, $WO_3$, ZnO, and combinations thereof, and the second oxide layer comprises $Al_2O_3$.

* * * * *